US011895931B2

(12) United States Patent
Hertzberg et al.

(10) Patent No.: US 11,895,931 B2
(45) Date of Patent: Feb. 6, 2024

(54) FREQUENCY TUNING OF MULTI-QUBIT SYSTEMS

(71) Applicant: INTERNATIONAL BUSINESS MACHINES CORPORATION, Armonk, NY (US)

(72) Inventors: Jared B. Hertzberg, Ossining, NY (US); Jason S. Orcutt, Katonah, NY (US); Hanhee Paik, Danbury, CT (US); Sami Rosenblatt, White Plains, NY (US); Martin O. Sandberg, Ossining, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 44 days.

(21) Appl. No.: 15/824,492

(22) Filed: Nov. 28, 2017

(65) Prior Publication Data
US 2019/0165244 A1 May 30, 2019

(51) Int. Cl.
*H10N 60/01* (2023.01)
*G06N 10/00* (2022.01)
*H10N 60/12* (2023.01)
*H10N 60/80* (2023.01)

(52) U.S. Cl.
CPC ......... *H10N 60/0884* (2023.02); *G06N 10/00* (2019.01); *H10N 60/0661* (2023.02); *H10N 60/0912* (2023.02); *H10N 60/12* (2023.02); *H10N 60/805* (2023.02)

(58) Field of Classification Search
None
See application file for complete search history.

(56) References Cited

U.S. PATENT DOCUMENTS

| 4,163,156 A | * | 7/1979 | Daetwyler | .......... | H01L 39/2493 |
| | | | | | 250/310 |
| 4,220,959 A | | 9/1980 | Kroger | | |
| 4,490,901 A | | 1/1985 | Clark et al. | | |
| 4,535,219 A | | 8/1985 | Sliwa, Jr. | | |
| 6,218,214 B1 | | 4/2001 | Panchou et al. | | |
| 6,232,212 B1 | | 5/2001 | Degani et al. | | |
| 6,495,915 B1 | | 12/2002 | Hsieh et al. | | |

(Continued)

FOREIGN PATENT DOCUMENTS

| CN | 101868802 A | 10/2010 |
| CN | 103745969 A | 4/2014 |

(Continued)

OTHER PUBLICATIONS

Granata et al. "Trimming of Critical Current in Niobium Josephson Devices by Laser Annealing", Journal of Physics: Conference Serices 97 (2008) 012110, pp. 1-6 (Year: 2008).*

(Continued)

*Primary Examiner* — Vincent Wall
(74) *Attorney, Agent, or Firm* — Amin, Turocy & Watson, LLP

(57) ABSTRACT

The invention includes methods, and the structures formed, for multi-qubit chips. The methods may include annealing a Josephson junction of a qubit to either increase or decrease the frequency of the qubit. The conditions of the anneal may be based on historical conditions, and may be chosen to tune each qubit to a desired frequency.

24 Claims, 19 Drawing Sheets

(56) References Cited

U.S. PATENT DOCUMENTS

| | | | |
|---|---|---|---|
| 6,630,723 B2 | 10/2003 | Hedler et al. | |
| 6,999,652 B2 | 2/2006 | Mino | |
| 7,002,166 B2 | 2/2006 | Jamieson et al. | |
| 7,122,837 B2 | 10/2006 | Linares et al. | |
| 7,176,066 B2 | 2/2007 | Brenner et al. | |
| 7,343,059 B2 | 3/2008 | Beausoleil et al. | |
| 7,394,268 B2 | 7/2008 | Bertin et al. | |
| 7,411,187 B2 | 8/2008 | Monroe et al. | |
| 7,466,725 B2 | 12/2008 | Ichimura et al. | |
| 7,679,166 B2 | 3/2010 | Anderson et al. | |
| 7,899,092 B2 | 3/2011 | Malinovsky | |
| 7,977,668 B2 | 7/2011 | Nevirkovets et al. | |
| 8,054,072 B2 | 11/2011 | Ichimura et al. | |
| 8,111,083 B1 | 2/2012 | Pesetski et al. | |
| 8,148,715 B2 | 4/2012 | Hollenberg et al. | |
| 8,329,556 B2 | 12/2012 | Yuan et al. | |
| 8,440,471 B2 | 5/2013 | Ranjan et al. | |
| 8,816,325 B2 | 8/2014 | Schenkel et al. | |
| 9,054,298 B2 | 6/2015 | Zhou et al. | |
| 9,082,637 B2 | 7/2015 | Taylor | |
| 9,208,280 B2 | 12/2015 | Bocharov et al. | |
| 9,219,298 B2 | 12/2015 | Abraham et al. | |
| 9,350,460 B2 | 5/2016 | Paik | |
| 9,355,362 B2 | 5/2016 | Shea | |
| 9,443,200 B2 | 9/2016 | Schroff | |
| 9,524,470 B1 | 12/2016 | Chow et al. | |
| 9,599,904 B2 | 3/2017 | Schubert et al. | |
| 9,607,271 B2 | 3/2017 | Papile | |
| 9,647,662 B1 | 5/2017 | Abutaleb et al. | |
| 9,858,531 B1 | 1/2018 | Monroe | |
| 10,134,972 B2 | 11/2018 | Oliver et al. | |
| 10,359,272 B2 | 7/2019 | Mower | |
| 10,418,540 B2 | 9/2019 | Orcutt | |
| 10,423,888 B1 | 9/2019 | Hertzberg et al. | |
| 2002/0074544 A1 | 6/2002 | Sung et al. | |
| 2003/0193097 A1 | 10/2003 | Il'ichev et al. | |
| 2005/0074220 A1 | 4/2005 | Rey | |
| 2005/0170572 A1 | 8/2005 | Hongo et al. | |
| 2007/0272669 A1 | 11/2007 | Comley et al. | |
| 2008/0258049 A1 | 10/2008 | Kuzmich et al. | |
| 2009/0041243 A1 | 2/2009 | Nambu | |
| 2009/0057652 A1 | 3/2009 | Nevirkovets et al. | |
| 2013/0003188 A1 | 1/2013 | Andreasch et al. | |
| 2013/0029848 A1* | 1/2013 | Gonzalez | H01L 39/14 505/210 |
| 2013/0119351 A1 | 5/2013 | Shea et al. | |
| 2013/0258595 A1 | 10/2013 | Tuckerman | |
| 2014/0328116 A1 | 11/2014 | Guo | |
| 2015/0021726 A1 | 1/2015 | Min et al. | |
| 2015/0310350 A1 | 10/2015 | Niskanen et al. | |
| 2015/0316598 A1 | 11/2015 | Rogge et al. | |
| 2016/0292586 A1 | 10/2016 | Rigetti et al. | |
| 2016/0321558 A1 | 11/2016 | Nakamura et al. | |
| 2016/0343934 A1 | 11/2016 | Chang et al. | |
| 2016/0344414 A1 | 11/2016 | Naaman et al. | |
| 2017/0001900 A1 | 1/2017 | Marjanovic et al. | |
| 2017/0059964 A1 | 3/2017 | Nakamura et al. | |
| 2017/0072504 A1 | 3/2017 | Abraham et al. | |
| 2017/0076787 A1 | 3/2017 | Frank | |
| 2017/0077382 A1 | 3/2017 | Abraham et al. | |
| 2017/0133336 A1 | 5/2017 | Oliver et al. | |
| 2017/0177534 A1* | 6/2017 | Mohseni | H03K 19/195 |
| 2018/0012932 A1 | 1/2018 | Oliver et al. | |
| 2018/0013052 A1 | 1/2018 | Oliver et al. | |
| 2018/0102469 A1 | 4/2018 | Das et al. | |
| 2018/0102470 A1 | 4/2018 | Das et al. | |
| 2018/0267250 A1 | 9/2018 | Hosseini | |
| 2018/0337790 A1 | 11/2018 | Brink et al. | |
| 2018/0356597 A1 | 12/2018 | Spector | |
| 2019/0051810 A1 | 2/2019 | Brink et al. | |

FOREIGN PATENT DOCUMENTS

| | | |
|---|---|---|
| CN | 105052038 A | 11/2015 |
| DE | 102009033566 A1 | 1/2011 |
| EP | 2202545 A1 | 6/2010 |
| JP | H09-252026 A | 9/1997 |
| JP | 3198655 B2 | 8/2001 |
| JP | 2004-274567 A | 9/2004 |
| JP | 2007193778 A | 8/2007 |
| JP | 2019-504511 A | 2/2019 |
| WO | 9822985 A2 | 5/1998 |
| WO | 2017075246 A1 | 5/2017 |
| WO | 2017105524 A1 | 6/2017 |
| WO | 2017131831 A2 | 8/2017 |

OTHER PUBLICATIONS

Baek et al. "Thermal stability of Nb/a-NbxSi1-x/NB Josephson junctions", Physical Review B 75, 054514 pp. 1-6 (2007) (Year: 2007).*

Pop et al., "Fabrication of stable and reproducible sub-micron tunnel junctions", arXiv: 1105.6204v1 [cond-mat.mes-hall], May 31, 2011 (Year: 2011).*

"Aging- and annealing-induced variations in Nb/AI-AIOx/Nb tunnel junction properties", Journal of Applied Physics 109, 024502 ( 2011) pp. 1-5 (Year: 2011).*

Kamal et al., "Improved superconducting qubit coherence with high-temperature substrate annealing", https://arxiv.org/pdf/1606.09262.pdf, Jun. 29, 2016, pp. 1-10. (Year: 2016).*

Wu Yu-Lin et al., "Fabrication of Al/AlOx /Al Josephson junctions and superconducting quantum circuits by shadow vaporation and a dynamic oxidation process", 2013 Chinese Phys. B 22 060309 (Year: 2013).*

Hutchings et al., "Tunable Superconducting Qubits with Flux-Independent Coherence", pp. 1-17, arVix 1702.02253v2, Feb. 21, 2017 (Year: 2017).*

Pavlovic, Dusko, "Relating toy models of quantum computation: comprehension, complementarity and dagger mix autonomous categories", https://arxiv.org/pdf/1006.1011.pdf, Jun. 5, 2010, pp. 1-21 (Year: 2010).*

*Amgen v. Sanofi*, No. 21-757, (U.S.) decided May 18, 2023. (Year: 2023).*

Orcutt et al., "Laser Annealing Qubits for Optimized Frequency Allocation", U.S. Appl. No. 15/823,728, filed Nov. 28, 2017, 35 Pages.

Rosenblatt et al., "Laser Annealing of Qubits With Structured Illumination", U.S. Appl. No. 15/823,713, filed Nov. 28, 2017, 39 Pages.

Hertzberg et al., "Frequency Tuning of Multi-Qubit Systems", U.S. Appl. No. 15/824,438, filed Nov. 28, 2017, 21 Pages.

Rosenblatt et al., "Flip Chip Integration On Qubit Chips", U.S. Appl. No. 15,823,675, filed Nov. 28, 2017, 33 Pages.

List of IBM Patents or Patent Applications Treated as Related, dated Jan. 8, 2018, 2 pages.

Granata et al., "Trimming of Critical Current in Niobium Josephson Devices by Laser Annealing", 8th European Conference on Applied Superconductivity (EUCAS 2007), Journal of Physics: Conferences Series 97 (2008), Copyright 2008, 6 Pages, IOP Publishing.

Hadden et al., "Waveguide-coupled single NV in diamond enabled by femtosecond laser writing", Apr. 7, 2010, 5 Pages, Institute for Quantum Science and Technology, University of Calgary, Calgary, Canada.

Knoernschild et al., "Independent individual addressing of multiple neutral atom qubits with a micromirror-based beam steering system", Applied Physics Letters 97, Sep. 2010, 3 Pages, Copyright 2010 American Institute of Physics.

Mehta et al., "Integrated Optical Adressing of an ion qubit", Nature Nanotechnology, Dec. 2016, pp. 1066-1070, Copyright 2016 Macmillan Publishers Limited, Department of Electrical Engineering & Computer Science and Research Laboratory of Electronics, Massachusetts Institute of Technology, Cambridge, MA.

(56) References Cited

OTHER PUBLICATIONS

Wale, "Self Aligned, Flip Chip Assembly of Photonic Devices with Electrical and Optical Connections", Electronic Components and Technology Conference, 1990, IEEE, 8 pages.

Lee et al., "3D Stacked Flip Chip Packaging with Through Silicon Vias and Copper Plating or Conductive Adhesive Filling", 2005 Electronic Components and Technology Conference, Copyright 2005 IEEE, 7 pages.

Rodin et al., "High Throughput Low CoO Industrial Laser Drilling Tool", Research Gate, Center for Physical Sciences and Technology, Jul. 2008, 7 pages.

Duocastella et al., "Bessel and annual beams for materials processing," Laser Photonics Rev. 6, No. 5, 607-621 (2012), DOI 10.1002/lpor.201100031.

Chen et al. "Qubit architecture with high coherence and fast tunable coupling." Physical review letters 113.22 (2014): 220502, abstract, 5 pgs.

Gilabert et al., "Photoinduced enhancement of the Josephson effect in YBaCuO grain boundary junctions," Journal of Low Temperature Physics, Feb. 1997, vol. 106, Issue 3, pp. 255-264.

Granata et al., "Induced change of critical current density profile in Nb/AI-AIOx/Nb Josephson junctions," Journal of Physics: Conference Series 507 (2014) 042046, 5 pgs.

Granata et al., "Localized laser trimming of critical current in niobium based Josephson devices," App. Phys. Lett. 90, 232503 (2007), doi: 10.1063/1.2746060, 4 pgs.

Granata et al., "Spatial modulation of critical current density in niobium based Josephson junctions induced by selective heating," Appl. Phys. Lett. 102, 222603 (2013); doi: 10.1063/1.4809737, 5 pgs.

Hutchings et al. "Tunable Superconducting Qubits with Flux-Independent Coherence." arXiv preprint arXiv:1702.02253 (2017), pp. 1-17.

Mount et al., "Single qubit manipulation in a microfabricated surface electrode ion trap," New Journal of Physics, vol. 15, Sep. 2013, 17 pgs.

Shim et al., "Bottom-up superconducting and Josephson junction devices inside a Group-IV semiconductor," Nature Communications, 5, 4225 (2014), arXiv:1309.0015v3, 9 pgs.

Saffman, "Quantum Computing with Atomic Qubits and Rydberg Interactions: Progress and Challenges", Journal of Physics B: Atomic, Molecular and Optical Physics, May 17, 2016, 25 Pages, OP Publishing Ltd., Copyright 2016, UK.

Lagoudakis et al., "Initialization of a spin qubit in a site-controlled nanowire quantum dot", New Journal of Physics, 2016, 8 Pages, Published in a partnership with Deutsche Physlakalsche Gesellschaft and the Institute of Physics, IOP Science, Canada.

Rioux et al., "Linear, annular, and radial focusing with axicons and applications to laser machining", Applied Optics, vol. 17, Issue 10, pp. 1532-1536 (1978), https://doi.org/10.1364/AO.17.001532, Abstract Only.

International Search Report and Written Opinion, International Application No. PCT/EP2018/080736, 10 pgs., dated Mar. 6, 2019.

Pending U.S. Appl. No. 16/183,376, filed Nov. 7, 2018, entitled: "Laser Annealing of Qubits With Structured Illumination", 39 pages.

Notification of Transmittal of The International Search Report and The Written Opinion of The International Searching Authority, or The Declaration, dated Jan. 30, 2019, International application No. PCT/EP2018/080735, 16 pages.

Braslau et al., "Fabrication of Planar Josephson Junctions by Laser Irradiation", An IP.com Prior Art Database Technical Disclosure, Original Publication Date: Apr. 1, 1976, IP.com No. IPCOM000085574D, IP.com Electronic Publication Date: Mar. 2, 2005, 2 pages.

Pending U.S. Appl. No. 16/251,569, filed Jan. 18, 2019, entitled: "Flip Chip Integration on Qubit Chips", 33 pages.

IBM: List of IBM Patents or Patent Applications Treated as Related (Appendix P), Jan. 28, 2019, 2 pages.

IBM: List of IBM Patents or Patent Applications Treated as Related (Appendix P), Jul. 31, 2019, 2 bages.

Pending U.S. Appl. No. 16/520,490, filed Jul. 24, 2019, entitled: "Adjustment of Qubit Frequency Through Annealing", 27 pages.

Brink et al., "Device challenges for near term superconducting quantum processors: frequency collisions", @2018 IEEE, IEDM18-126, pp. 6.1.1-6.1.3.

Chamberland et al., "Topological and subsystem codes on low-degree graphs with flag qubits", arXiv:1907.09528v1 [quant-ph] Jul. 22, 2019, pp. 1-20.

Hutchings et al., "Tunable Superconducting Qubits with Flux-Independent Coherence", arXiv:1702.02253v2 [cond-mat.supr-con] Feb. 21, 2017, pp. 1-17.

Magesan et al., "Effective Hamiltonian models of the cross-resonance gate", arXiv:1804.04073v2 [quant-ph] Feb. 25, 2019, pp. 1-16.

Cambridge University Press, "Quantum Error Correction", https://www.google.com/books/edition/Quantum_Error_Correction/XV9sAAAAQBAJ?hl=en&gbpv=0, Published Sep. 12, 2013, 690 pages.

Office Action received for Chinese Patent Application Serial No. 201880075209.0 dated Apr. 4, 2023, 8 pages (Original copy only).

Office Action received for Chinese Patent Application Serial No. 201880075199.0 dated Apr. 4, 2023, 6 pages (Original copy only).

Notice of Reasons for Refusal received for Japanese Patent Application Serial No. 2020-526116 dated Jun. 29, 2022, 6 pages.

\* cited by examiner

SECTION B-B

FREQUENCY TUNING OF MULTI-QUBIT SYSTEMS

BACKGROUND

The present invention relates to fabrication of quantum computing device and, more specifically, to tuning the frequency of multi-qubit systems.

In quantum computing, a qubit or quantum bit is a unit of quantum information—the quantum analogue of the classical bit. A qubit is a two-state quantum-mechanical system, such as the polarization of a single photon: here the two states are vertical polarization and horizontal polarization. In a classical system, a bit would have to be in one state or the other. However, quantum mechanics allows the qubit to be in a superposition of both states at the same time, a property that is fundamental to quantum computing. Several implementations of quantum computers are based on superconducting circuits. These types of implementations typically contain Josephson junctions. The properties of the Josephson junction can have significant effect on the performance of the circuits.

BRIEF SUMMARY

An embodiment of the invention may include a method of forming a multi-qubit chip and the resulting structure. The method may include forming a plurality of qubits on a chip, wherein each qubit comprises a Josephson junction. The method may include determining an initial frequency of each qubit on the chip. The method may include determining a desired frequency for each qubit of the chip based on the first frequency. The method may include annealing a first Josephson junction of a first qubit of the plurality of qubits, where annealing the first Josephson junction causes the first qubit to change from the first frequency to about the desired frequency. This may allow for forming a multi-qubit chip optimized based on fabrication conditions.

A further embodiment of forming the multi-qubit chip may include annealing the first Josephson junction using localized annealing of the first Josephson junction. This may allow for adjustment of the Josephson junction without affecting other components of the qubit.

A further embodiment of forming the multi-qubit chip may include annealing the first Josephson junction, which causes the first frequency to increase. This may allow for adjustment of the frequency to a setpoint above the fabrication frequency.

A further embodiment of forming the multi-qubit chip includes annealing a second Josephson junction of a second qubit of the plurality of qubits, where annealing the second Josephson junction causes a second frequency of the second qubit to decrease to a second desired frequency. This may allow for adjustment of the frequency of qubits independently of each other.

A further embodiment of forming the multi-qubit chip may include annealing the first Josephson junction, which causes the first frequency to decrease. This may allow for adjustment of the frequency to a setpoint below the fabrication frequency.

A further embodiment of forming the multi-qubit chip may include a parameter for annealing the first Josephson junction based on a parameter contained in a historical database relating anneal parameters to frequency shifts. This may allow for an accurate adjustment based on previous adjustments.

A further embodiment of forming the multi-qubit chip may include forming the plurality of qubits based on the desired frequency for each of the plurality of qubits, and wherein the dimensions of the first qubit are different from the dimensions of a second qubit of the plurality of qubits. This may allow for further tuning of the chip based on varying the size and shape of the individual qubits.

An embodiment of the invention may include a method of forming a multi-qubit chip and the resulting structure. The method may include determining a desired frequency for a plurality of qubits on a chip. The method may include forming the plurality of qubits on the chip, wherein each qubit comprises a Josephson junction. The method may include determining a first frequency of a first qubit of a plurality of qubits. The method may include annealing the Josephson junction, where annealing the Josephson junction causes the qubit to change from the first frequency to about the desired frequency. This may allow for design of quantum chips with standardized frequencies.

A further embodiment of forming the multi-qubit chip may include annealing the first Josephson junction using localized annealing of the first Josephson junction. This may allow for adjustment of the Josephson junction without affecting other components of the qubit.

A further embodiment of forming the multi-qubit chip may include annealing the first Josephson junction, which causes the first frequency to increase. This may allow for adjustment of the frequency to a setpoint above the fabrication frequency.

A further embodiment of forming the multi-qubit chip further includes annealing a second Josephson junction of a second qubit of the plurality of qubits, where annealing the second Josephson junction causes a second frequency of the second qubit to decrease to a second desired frequency. This may allow for adjustment of the frequency of qubits independently of each other.

A further embodiment of forming the multi-qubit chip may include annealing the first Josephson junction, which causes the first frequency to decrease. This may allow for adjustment of the frequency to a setpoint below the fabrication frequency.

A further embodiment of forming the multi-qubit chip may include a parameter for annealing the first Josephson junction is based on a parameter in a historical database relating anneal parameters to frequency shifts. This may allow for an accurate adjustment based on previous adjustments.

A further embodiment of forming the multi-qubit chip may include forming the plurality of qubits based on the desired frequency for each of the plurality of qubits, and wherein the dimensions of the first qubit are different from the dimensions of a second qubit of the plurality of qubits. This may allow for further tuning of the chip based on varying the size and shape of the individual qubits.

An embodiment may include a multi-qubit chip. The multi-qubit chip may contain a first qubit containing a first Josephson junction. The multi-qubit chip may contain a second qubit containing a second Josephson junction, wherein a first resistance of the first Josephson junction and a second resistance of the second Josephson junction are different. This may allow the multi-qubit chip to operate at different frequencies.

A further embodiment of the multi-qubit chip may include a difference between the first resistance and the second resistance, which causes a first frequency of the first qubit to not collide with a second frequency of the second qubit. This allows the first qubit and second qubit to operate without collision, which may enable improved coherence time of the multi-qubit chip.

BRIEF DESCRIPTION OF THE DRAWINGS

The drawings included in the invention are incorporated into, and form part of, the specification. They illustrate embodiments of the invention and, along with the description, serve to explain the principles of the disclosure. The drawings are only illustrative of certain embodiments and do not limit the disclosure.

DETAILED DESCRIPTION

Figure 1:
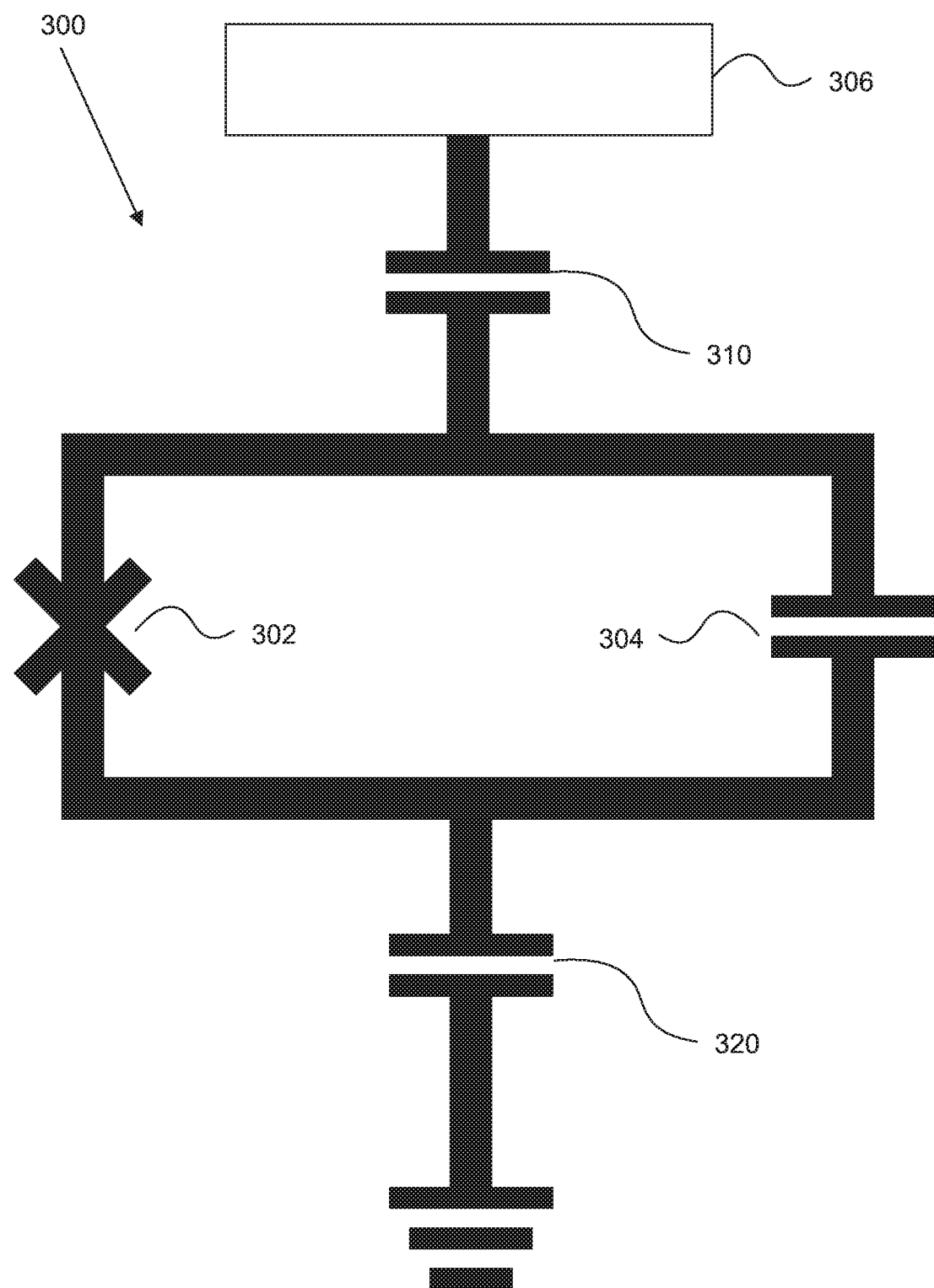
FIG. 1 illustrates an example qubit circuit diagram, in accordance with embodiments of the invention.

Exemplary embodiments now will be described more fully herein with reference to the accompanying drawings, in which exemplary embodiments are shown. This disclosure may, however, be embodied in many different forms and should not be construed as limited to the exemplary embodiments set forth herein. Rather, these exemplary embodiments are provided so that this disclosure will be thorough and complete and will convey the scope of this disclosure to those skilled in the art. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements. The term substantially, or substantially similar, refer to instances in which the difference in length, height, or orientation convey no practical difference between the definite recitation (e.g. the phrase sans the substantially similar term), and the substantially similar variations. In one embodiment, substantially similar (and its derivatives such as, for example, about) denote a difference by a generally accepted engineering or manufacturing tolerance, up to, for example, 10% deviation in value or 10° deviation in angle.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Multi-qubit chips are employed in creating quantum computing systems. However, each additional qubit added to a chip adds to the design complexity of the chip, as a qubit may have quantum interactions with other proximate qubits, based on their resonance frequency. Such behavior constitutes a failure mode known as a "frequency collision." Frequency collisions can be predicted by modeling of the quantum-mechanical system. A non-limiting example of frequency collision happens when the resonance frequency of two proximate qubits are similar (e.g., when the frequency of one qubit equals the frequency of another qubit). In order to achieve high performance it is desirable to be able to set the frequency of each qubit very precisely. Traditionally, adjustable magnetic fields have been used to shift the frequency of qubits, but the necessary tuning circuits tend to introduce noise and add extra complexity within a multi-qubit system.

In example embodiments of the present invention, the qubit includes the following properties: during measurement, the qubit is projected into one of two different states ($|A\rangle$ or $|B\rangle$). Read-out occurs while the two states $|A\rangle$ and $|B\rangle$ are stable, after which the qubit decoheres. The readout resonator attains a resonance frequency based upon the state of the projected qubit.

The projected state of the qubit can be inferred based on the readout resonator frequency, which can be determined based on the reflection or transmission coefficient of the readout resonator. This can be accomplished through various techniques. In an example technique, a microwave signal is applied to the input of the circuit and is tuned to a frequency approximately equal to the resonance frequency of one of the post measurement quasi-stable states in accordance with one example embodiment. When the qubit is projected into the measured state, the applied microwave signal either transmits to the output or is reflected by the readout resonator, depending on the coupling of the qubit to the transmission lines. Therefore, depending on the qubit state, the microwave signal will acquire a specific magnitude and phase. The determination of the qubit state from this signal can be done in a variety of ways, for example, using IQ mixers, threshold detectors and so forth. Other various methods for measuring frequency or state may be used as well.

In some cases, additional amplifiers such as SQUID amplifiers or HEMT amplifiers may be required as well as room temperature microwave electronics such as IQ mixers, and so forth.

Referring now to FIG. 1, illustrated is a qubit 300, in accordance with embodiments of the present invention. In some embodiments, the qubit 300 contains a Josephson junction 302 and a capacitor 304 connected in parallel with one another, as shown in FIG. 1. The parallel Josephson junction 302 and capacitor 304 arrangement is capacitively coupled by a coupling capacitor 310 to structure 306, as well as capacitively coupled by a coupling capacitor 320 to ground. While only a single structure is shown capacitively coupled to the Josephson junction 302 and capacitor 304, multiple structures may be attached to the parallel Josephson junction 302 and capacitor 304 arrangement depicted. For example, a readout structure and interconnects to other qubit structures may each be capacitively connected to the parallel Josephson junction 302 and capacitor 304 arrangement. Additionally, while qubit 300 is depicted as using coupling capacitor 310 and coupling capacitor 320, other methods of electrically connecting the qubit may be used. In accordance with one example embodiment, the capacitor 304 is in the range of 0.1 femtofarads (fF) to 200 femtofarads (fF). In accordance with one example embodiment, the Josephson junction 302 has an effective critical current ranging approximately from 10 to 100 nanoamperes. The critical current is related to the overall resistance of the Josephson junction, prior to achieving a superconducting state as predicted by the Ambegaokar-Baratoff relation. More specifically, the relation predicts that the resistance of the Josephson junction prior to achieving the superconducting state is inversely proportional to the critical current after turning superconducting. Furthermore, this critical current is also inversely proportional to the inductance of the Josephson junction.

As a result, the resonance frequencies of the qubit range approximately between a few hundred MHz up to about 20 GHz. The coupling capacitor 310 of the qubit can be engineered for high fidelity readout. The qubit described in this example embodiment is also known as a single-junction transmon qubit. Such a qubit is not susceptible to tuning using a magnetic field and its resonance frequency is therefore fixed by the parameters of the capacitor and junction formed at the time of fabrication. Other embodiments may utilize a qubit of another type (e.g., a phase qubit, a charge qubit). In other embodiments, two or more Josephson junctions arranged as series or parallel circuit elements may substitute for the single Josephson junction 302 depicted in FIG. 1.

Figure 2:
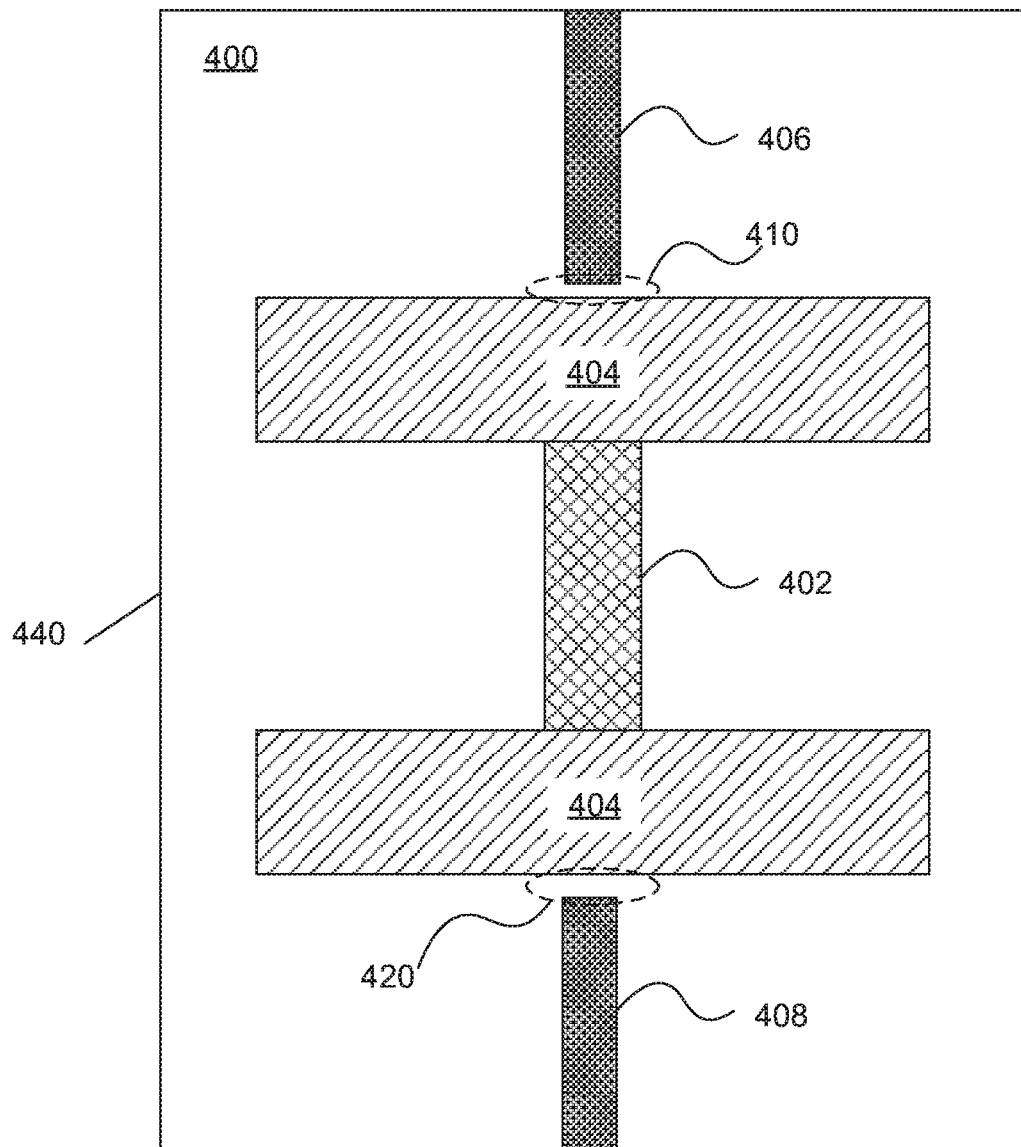
FIG. 2 illustrates a top view of an example qubit formed on a substrate, in accordance with embodiments of the invention.

Referring now to FIG. 2, illustrated is an example layout of an embodiment of a capacitively coupled qubit 440, like the qubit depicted in FIG. 1, following fabrication on substrate 400, in accordance with embodiments of the present invention. Fabrication of Josephson junction 402 may proceed by, for example, (1) subtractive patterning of a trilayer (superconductor(s)-insulator-superconductor(s)) material stack or (2) the Dolan bridge technique. The Dolan Bridge technique is described herein as an illustrative example. In such technique, the Josephson junction 402 is patterned between capacitive plates 404, which may be capacitively coupled, via capacitor 410, to line 406, and capacitively coupled to ground line 408, via capacitor 420, all located on substrate 400. While only a single line 406 is depicted, multiple lines may be communicatively coupled to capacitive plates 404, thus capacitively connecting qubit 400 to a plurality of structures.

In the example embodiment depicted in FIG. 2, the substrate 400 on which the qubit circuit is formed can be high resistivity (intrinsic) eight-inch silicon wafers. A bilayer of resist is spun on the wafers, such as a copolymer methyl methacrylate (MMA) layer and a subsequent thinner layer of polymethyl methacrylate (PMMA). Using electron-beam lithography, a pattern for the Josephson junction 402 is written into the resist. This step is followed by development in an MIBK:IPA (Methyl Isobutyl Ketone (MIBK) Isopropyl alcohol (IPA)) (1:3) solution for about one minute, which removes areas of the resist exposed to the electron beam. The MMA layer is more sensitive to the electron beam, which creates areas of undercut PMMA. As such, a suspended bridge out of the PMMA, also called a Dolan bridge, can be made with no MMA beneath. The sample is placed in an e-beam evaporator where Al is evaporated at two angles with oxidation (in an $Ar/O_2$ atmosphere) between Al evaporations. The junction is formed in the overlap area. The remaining resist and unwanted metal is removed by placing the sample in acetone. Using this lift-off technique, junction areas can be made ranging from 0.01 $\mu m^2$ to 1 $\mu m^2$. This basic fabrication process can be used with other extra fabrication steps such as PECVD, optical lithography, and RIE to make other devices. In example embodiments, the Josephson junction 402 is fabricated on a silicon (Si) substrate using aluminum as a starting compound to form an Al/AlOx/Al structure. In an example embodiment, the substrate 400 is selected to reduce dielectric loss tangent at low temperatures. The substrate 400 may also be selected to be a material which can be etched selectively to the superconducting and dielectric material to be used for the Josephson junction 402. For example, high resistivity Si wafers may be implemented.

In the example embodiment depicted in FIG. 2, capacitive plates 404 may comprise superconducting materials such as, for example, Nb, NbN, NbCN, NbTiN, and Pb. In an example embodiment, capacitive plates 404 may be about 1 to 100 micrometer apart. In an example embodiment, capacitive plates 404 may have a width of about 5 to about 500 micrometers, a length of about 1 to about 200 micrometers, and a height of about 10 to about 500 nanometers from the surface of substrate 400.

Figure 3A:
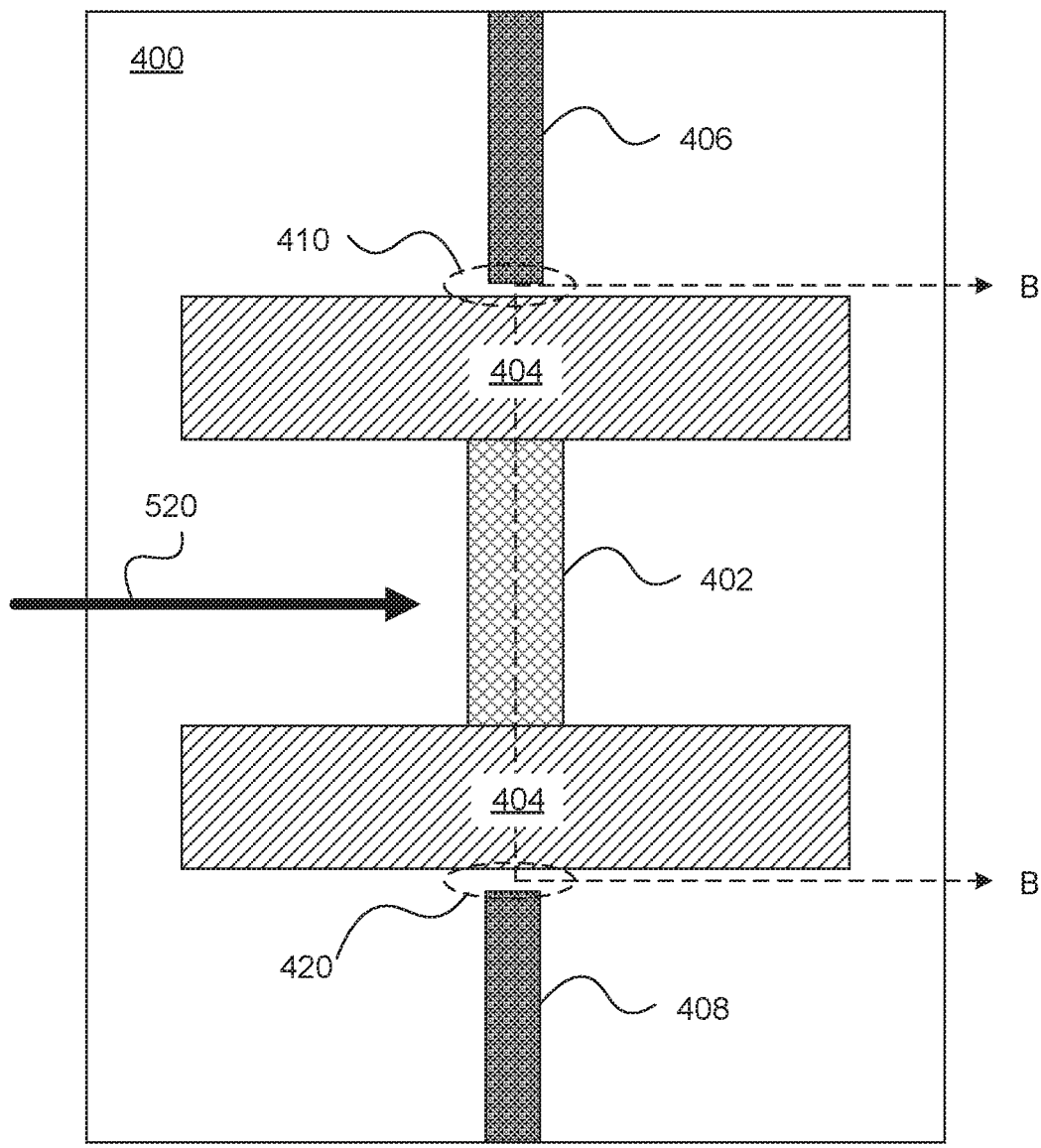
FIG. 3A illustrates a top view of an example chip with a qubit undergoing a laser anneal, in accordance with embodiments of the invention.

Referring to FIG. 3A, the qubit 440 may be annealed to adjust the resistance of the Josephson junction 402 in order to adjust the frequency of the qubit. Annealing of the Josephson junction 402 may include heating the Josephson junction 402 to allow for a physical change to occur within the Josephson junction 402 that results in a change in the resistance. In annealing of the Josephson junction 402, annealing below a threshold dose may result in an increase in the resistance of the Josephson junction 402, while annealing above that threshold may decrease the resistance of the Josephson junction 402. In an embodiment, annealing of the Josephson junction 402 may be done by laser annealing, via thermal source 520, which may enable localized heating to the Josephson junction 402. In an example embodiment, laser annealing may be performed using a doubled Nd:YAG source, emitting a laser having a 532 nm wavelength, however various other wavelengths of light may be used or tested to determine an optimal path to shift the frequency of the qubit. In the example embodiment, a threshold dose may be about 1.4 W for 10 seconds. Thus, in the example embodiment, annealing the Josephson junction 402 at doses below 1.4 W for 10 seconds would lead to an increase in resistance, while annealing at doses above 1.4 W for 10 seconds would lead to a decrease in resistance. In the example embodiment, the frequency shift achieved is based on the power, light frequency and duration of the anneal.

Figure 3B:
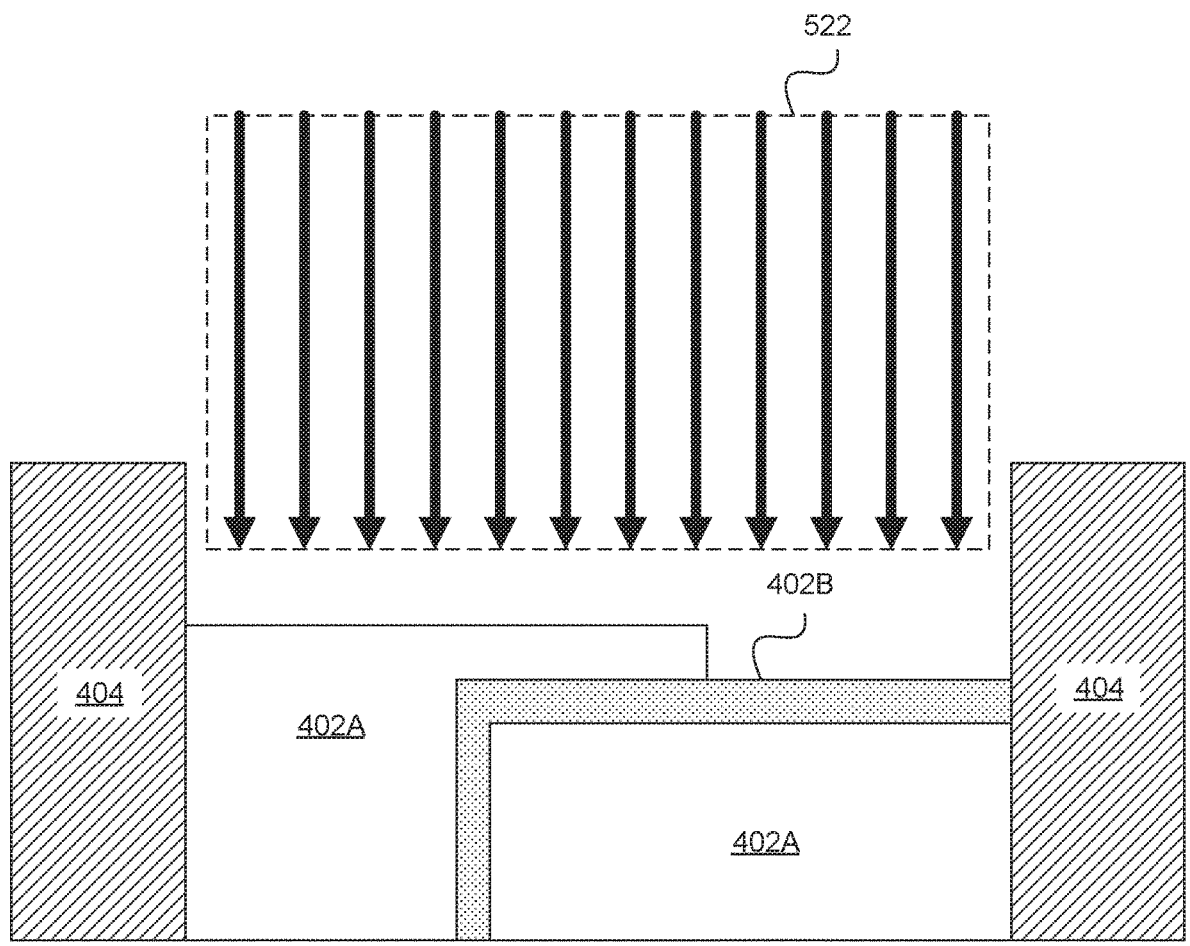
FIG. 3B illustrates a cross-sectional view of the example chip with a qubit undergoing a laser anneal of FIG. 3A, in accordance with embodiments of the invention.

Referring to FIG. 3B, an annealing pattern 522 of laser annealing Josephson junction 402 is depicted. FIG. 3B depicts a cross-sectional view of the chip of FIG. 3A, where Josephson junction 402 is depicted as its constituent layers, aluminum layers 402A and aluminum oxide layer 402B. In such embodiments, aluminum oxide layer 402B may be between 0.1 and 10 nm thick, which may allow quantum tunneling to occur between aluminum layers 402A. As should be understood, the arrangement depicted in FIG. 3B is an example arrangement of the Josephson junction 402, and other geometries may be used.

Still referring to FIG. 3B, annealing pattern 522 may be any pattern capable of changing the resistance of the Josephson junction 402 (FIG. 3A). In an example embodiment, the annealing pattern 522 may cover the entirety of aluminum layers 402A, as well as aluminum oxide layer 402B. In an example embodiment, the annealing pattern 522 may be focused such that it does not hit capacitive plates 404, and thus only localized annealing of the Josephson junction 402 occurs. The anneal may be performed using an annular beam focused only on Josephson junction 402, without contact onto capacitive plates 404, thereby promoting uniform heating of the Josephson junction 402.

In some embodiments, the annealing pattern 522 may be less than or equal to 10 microns in diameter, which may be the size of the beam spot of the thermal source 520 being applied to the Josephson junction 402 (e.g., a laser beam may have a 10 micron diameter). The annealing pattern 522 may be applied with the thermal source 520 depicted in FIG. 3A in order to decrease or increase the resistance of the Josephson junction 402, which may increase or decrease the frequency of a qubit associated with the Josephson junction 402. In some embodiments, the resistance of the Josephson junction 402 and the frequency of the qubit may have an inverse relationship (e.g., if the resistance of the Josephson junction 402 increases, the frequency of the qubit may decrease, or vice-versa, as long as the capacitance of the qubit is unaffected).

Figure 4:
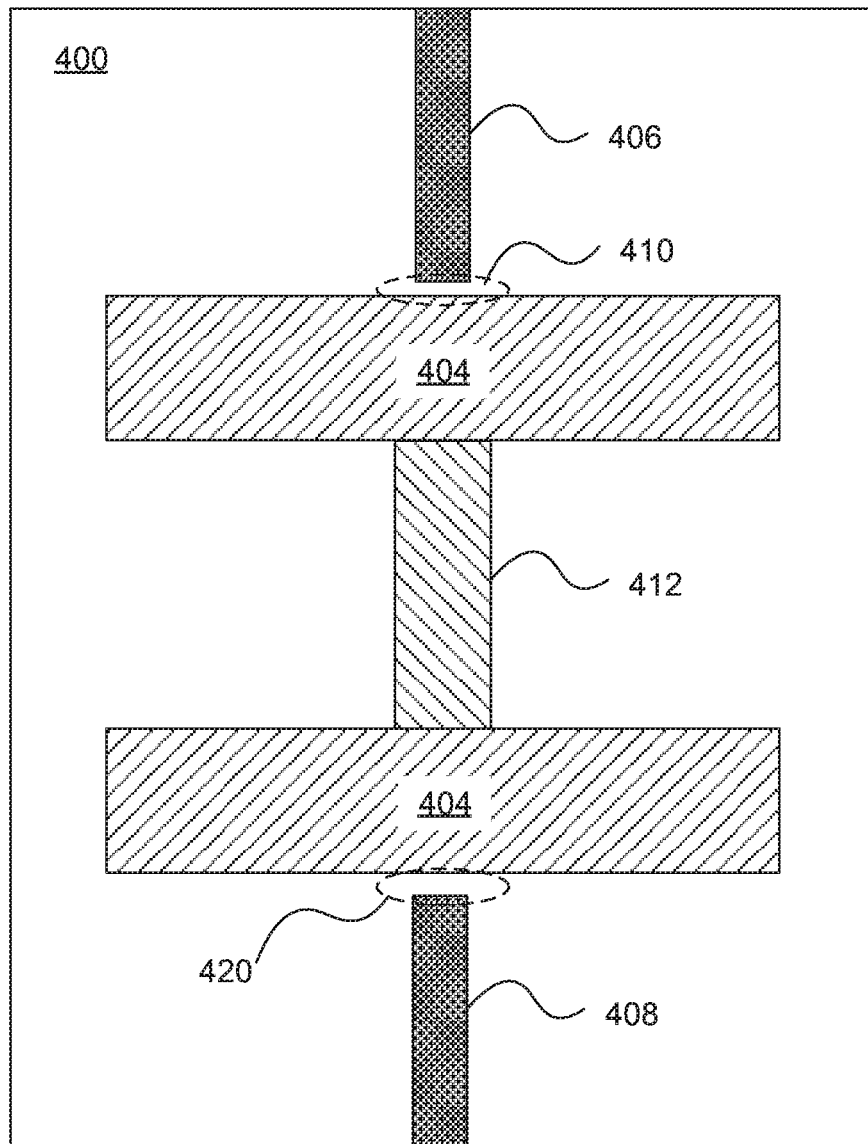
FIG. 4 illustrates a top view of an example qubit after a laser anneal, in accordance with embodiments of the invention.

Referring to FIG. 4, following removal of the thermal source 520 (FIG. 3A), a Josephson junction 412 may have a second resistance that is different from a first resistance of the Josephson junction 402 (FIG. 3A) prior to application of the thermal source 520. In some embodiments, the Josephson junction 412 may be at the second resistance until reapplication of the thermal source 520. The second resistance may differ from the original resistance of Josephson junction 402 based on the time, intensity and frequency of the thermal source 520.

Figure 5:
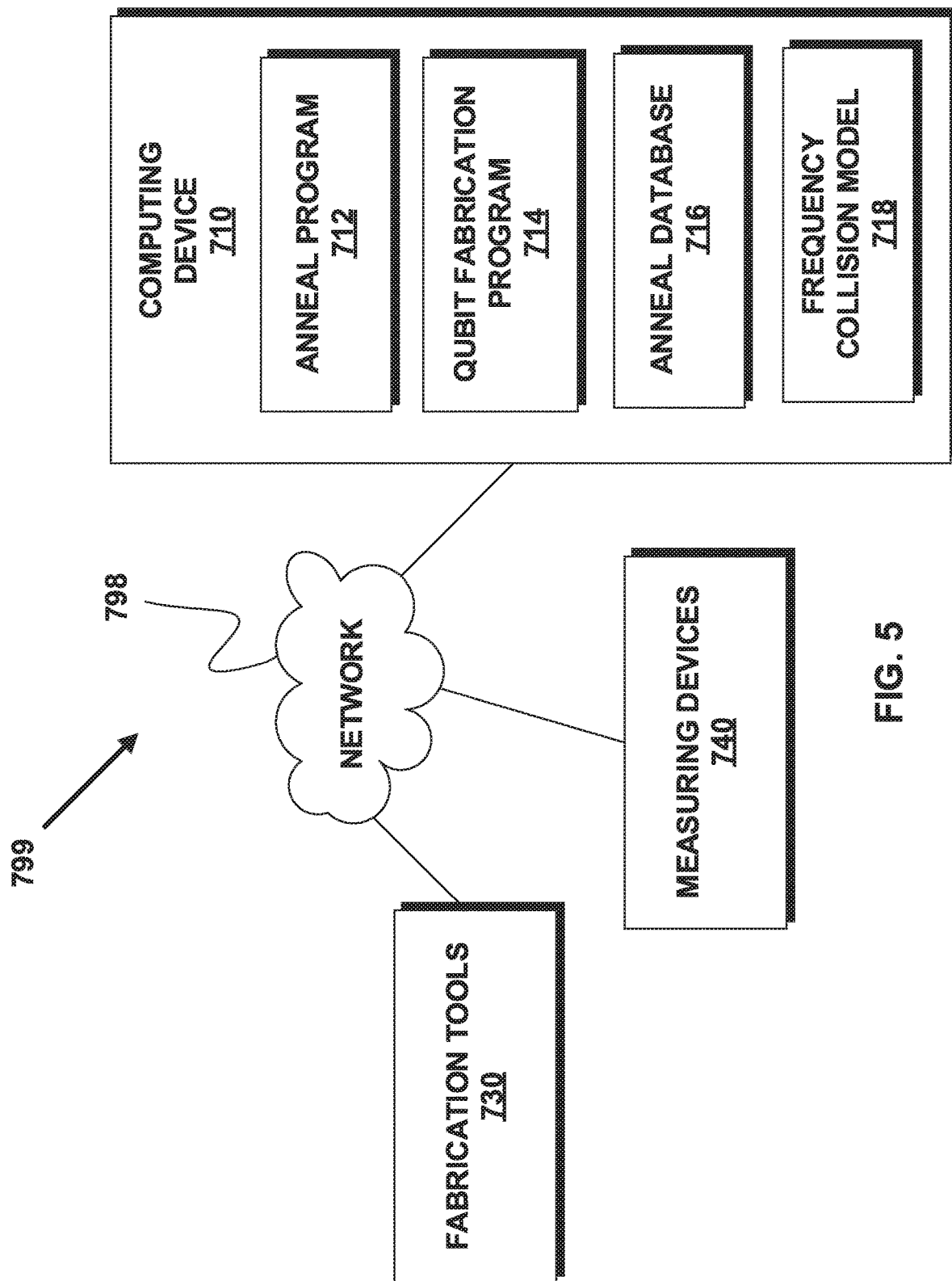
FIG. 5 illustrates a multi-qubit chip manufacturing system, in accordance with embodiments of the invention.

FIG. 5 illustrates a qubit fabrication system 799, in accordance with an embodiment of the invention. In an example embodiment, qubit fabrication system 799 includes computing devices 710, fabrication tools 730, and measuring devices 740 interconnected via a network 798.

Network 798 may include, for example, wired, wireless or fiber optic connections. In an embodiment, network 798 may be implemented as an intranet, a local area network (LAN), or a wide area network (WAN). In general, network 798 can be any combination of connections and protocols that will support communications between the computing devices 710, the fabrication tools 730, and measuring devices 740.

Fabrication tools 730 may include any device used in the fabrication of microelectronic devices, such as the fabrication of quantum computing chips. Fabrication tools 730 may be, for example, hardware capable of lithographic patterning, etching, material deposition, oxidation, annealing, etc. Fabrication tools 730 may include, for example, optical mask aligners, optical steppers, reactive ion etchers, sputtering deposition tools, electron beam writers, electron-beam evaporators, etc.

Measuring devices 740 may include any device used to measure the properties of a fabricated microelectronic device. Measuring devices 740 may detect, for example, resistance of a Josephson junction, frequency of a qubit, dimensions of a Josephson junction, dimensions of the capacitive plates, or any other desired characteristics. Measuring devices 740 may include, for example, parameter analyzers, probing stations, resistance bridges, Ohm-meters, lock in amplifiers, cryostats, network analyzers, etc.

Computing device 710 include anneal program 712, qubit fabrication program 714, anneal database 716, and frequency collision model 718. In the example embodiment, computing device 710 may include a desktop computer, a notebook or a laptop computer or any other electronic device or computing system capable of communicating with fabrication tools 730 and measuring devices 740 via network 798, and performing the computations necessary to operate anneal program 712, qubit fabrication program 714, and frequency collision model 718. While computing device 710 is depicted as a single device, the programs located on the computing device, such as anneal program 712, qubit fabrication program 714, anneal database 716, and frequency collision model 718, may be located on separate devices communicating with each other, or additionally a program may be operated on a plurality of computing devices. Computing device 710 is described in more detail with reference to FIG. 14.

Anneal program 712 is a program located on computing device 710 that develops a database of qubit processing conditions by relating a plurality of process conditions to the results achieved by those process conditions during annealing the Josephson junction. Anneal program 712 may send instructions to perform multiple different anneals on fabricated Josephson junctions, which may be fabricated without wiring as depicted as Josephson junction array 900 in FIG. 7A, or part of a qubit as depicted in qubit array 955 in FIG. 9A, to populate anneal database 716 with data. Anneal program 712 may subsequently modify, by annealing, each of the fabricated qubits to achieve a frequency, or resistance, set-point determined in conjunction with frequency collision model 718 to reduce the number of collisions between the qubits located on a chip. The set-points may be based on determining an optimized chip set-up based on the initial frequencies and resistances of qubits located on the chip. Alternatively, the set-points may be based on a standard chip design that is determined prior to the initial fabrication of the qubits, which may produce a standardized quantum chip. The operations and functions of anneal program 712 are described in further detail below with regard to FIG. 6.

Anneal database 716 is a database located on computing device 710. Anneal database 716 contains data corresponding to fabrication conditions, initial parameters, annealing parameters, post-anneal processing, and final parameters of Josephson junctions within or outside a qubit. In an example embodiment, anneal database 716 may contain data such as, for example, capacitor width, capacitor separation, Josephson junction tunnel barrier thickness, initial frequency of the qubit, initial resistance of the Josephson junction, number of anneals performed, anneal wavelength for each anneal, anneal power for each anneal, anneal duration for each anneal, resulting frequency of the qubit, resulting resistance of the Josephson junction, steady-state temperature achieved within a junction during each anneal, etc. The anneal database 716 may be used to store the process conditions, and the results of those conditions, in order to apply similar processes to reproduce an anneal of a Josephson junction to obtain specific attributes of the junction.

Frequency collision model 718 is a computer simulation of the interaction of qubits located on a chip, located on computing device 710. Frequency collision model 718 may specify a preferred pattern or arrangement of resonance frequencies for the qubits on the multi-qubit chip, or a preferred difference (in MHz or GHz) between the frequencies of adjacent qubits, so as to avoid frequency collisions. These specifications may take into account the design of a particular multi-qubit chip, the arrangement of couplings between various qubits on the chip, the energy levels of the qubits, and any other relevant factors. The frequency collision model 718 may use any statistical based modeling, such as a Monte Carlo model, in order to determine a probability, of collisions occurring based on fabrication parameters used in the fabrication tools 730 and fabrication program 714, and/or device parameters ascertained by the measuring devices 740 and anneal program 712.

Qubit fabrication program 714 is a program located on computing devices 710. Qubit fabrication program 714 may fabricate an initial quantum computing chip having a plurality of qubits using a frequency arrangement determined using frequency collision model 718 and annealing the plurality of qubits to a setpoint based on the anneal parameters contained in anneal database 716. The operations and functions of qubit fabrication program 714 are described in further details below with regard to FIG. 10 and FIG. 12.

Figure 6:
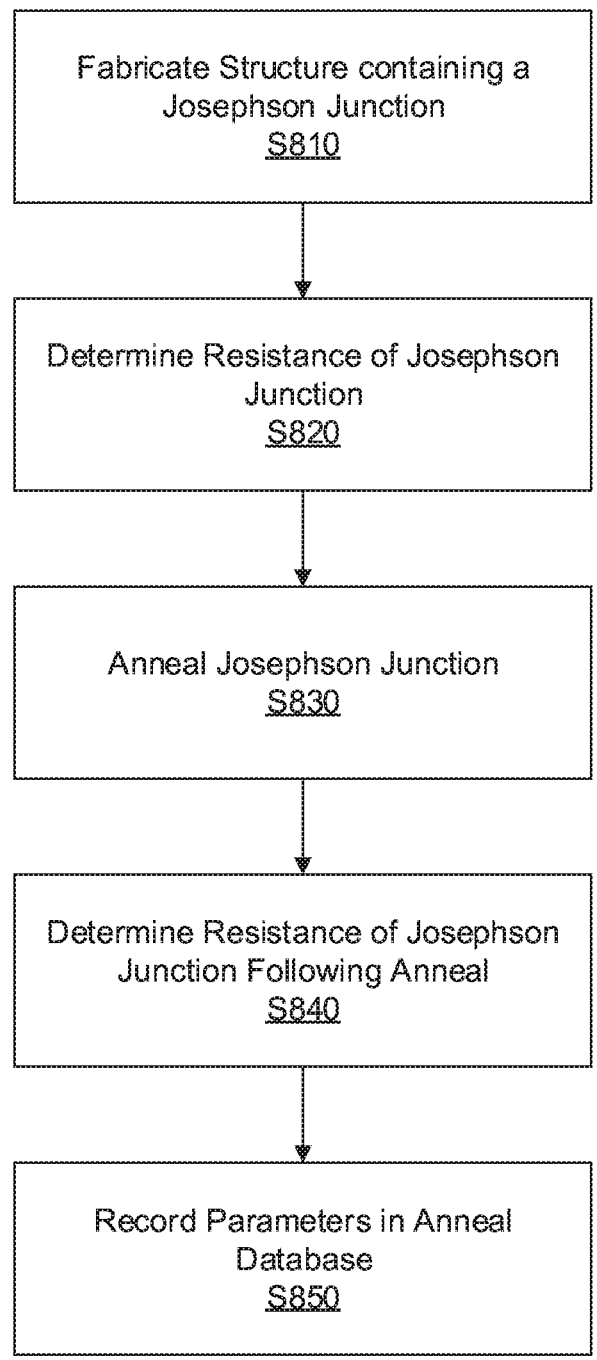
FIG. 6 is a flowchart illustrating the operations of the anneal program of FIG. 5, in accordance with embodiments of the invention.
Figure 7A:
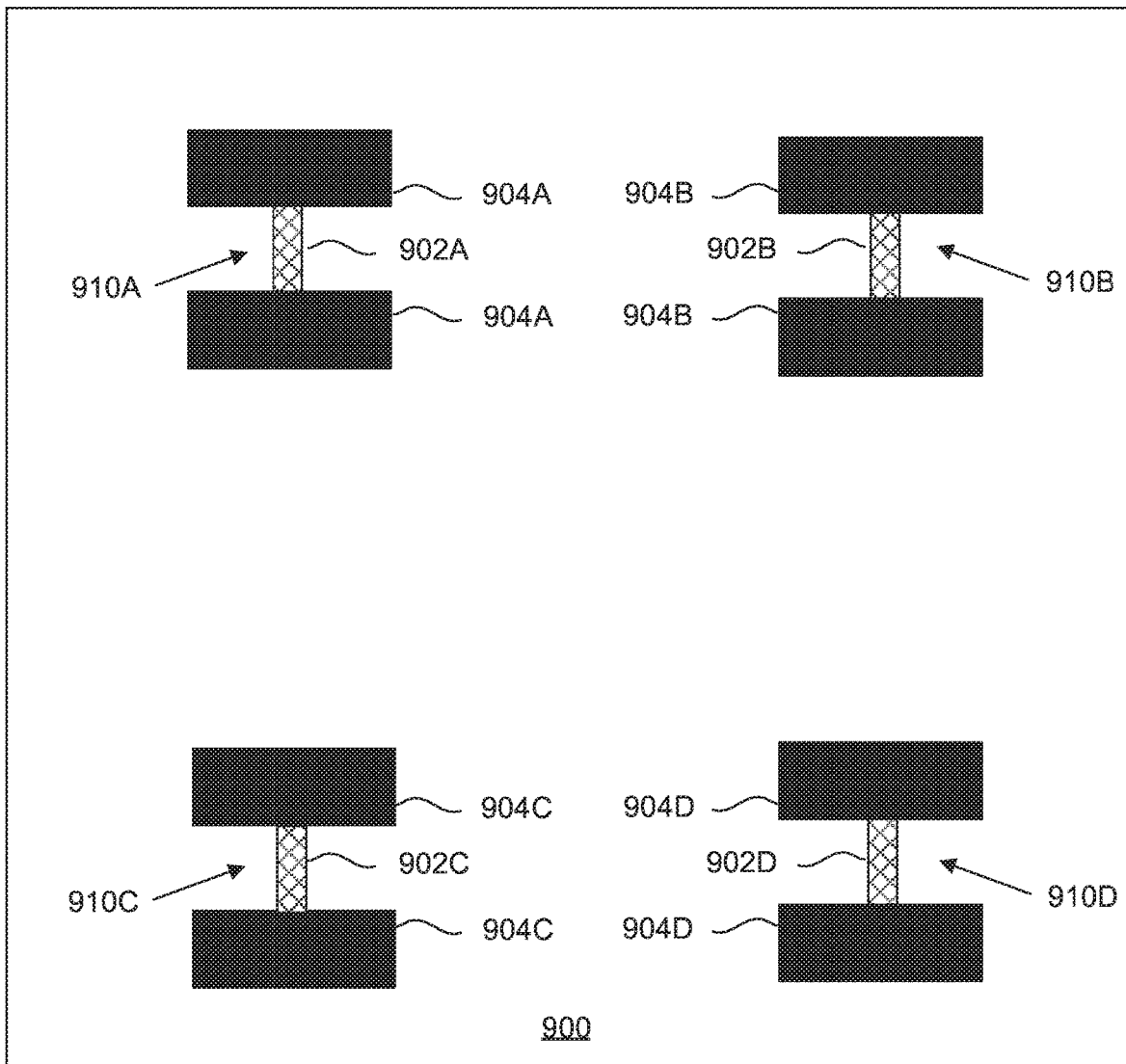
FIG. 7A illustrates a top view of a substrate containing multiple Josephson junctions, in accordance with embodiments of the invention.

FIG. 6 is a flow chart illustrating anneal program 712. Referring to step S810, a Josephson junction array 900, as depicted in FIG. 7A, is fabricated. Referring to FIG. 7A, a Josephson junction array 900, containing Josephson junction test structure 910A, Josephson junction test structure 910B, Josephson junction test structure 910C, and Josephson junction test structure 910D (hereinafter, collectively, the Josephson junction test structures 910), may be formed on a substrate according to the methods described above for forming a Josephson junction 402 on substrate 400. The Josephson junction test structures 910 may be formed concurrently with each other, consecutively or some combination thereof. Each of the Josephson junction test structures 910 contains a Josephson junction 902 (depicted as Josephson junction 902A, Josephson junction 902B, Josephson junction 902C, Josephson junction 902D), which are similar to Josephson junction 402, and probing pads 904 (depicted as probing pads 904A, probing pads 904B, probing pads 904C, probing pads 904D). Probing pads 904 may be similar to capacitive plates 404, but may be sized to allow for contacting of a resistance probe onto both probing pads 904 on opposite sides of the Josephson junction 902.

As a result of the fabrication process, the Josephson junction test structures 910 formed may have consistent dimensions (e.g. size and shape of probing pads 904). Therefore, the appearance of Josephson junction test structure 910A, Josephson junction test structure 910B, Josephson junction test structure 910C, and Josephson junction test structure 910D may be substantially similar, thereby forming Josephson junction test structures 910 with substantially uniform resistance across the substrate 400. However, formation of the Josephson junction 902 may exhibit an uncontrolled variation in the resistance of the Josephson junction 902 for given fabrication conditions, due to process parameters being uncontrolled at the nanometer level. For Josephson junctions utilized in single-junction transmon qubits this variation may be typically +/−2%. According to FIG. 7A, annealing may be performed to adjust the resistances of one or more of the Josephson junctions 902 in order to determine processing conditions that produce desired frequency shifts for a given set of qubits.

In additional instances, a previously annealed Josephson junction array may undergo additional annealing, in order to implement cumulative changes that result from the annealing process.

Referring to step S820, the resistance of the Josephson junction 902 of each Josephson junction test structure 910 is determined. In one embodiment, the resistance of the Josephson junction 902 may be determined at room temperature, or close to room temperature. In other embodiments, resistance may be measured at any suitable temperature, and may be selected as a matter of design or convenience. Measurement of resistance may be performed by a measuring device of measuring devices 740 by, for example, applying a current across probing pads 904 and measuring the voltage across the Josephson junction 902, in order to determine the resistance.

Figure 7B:
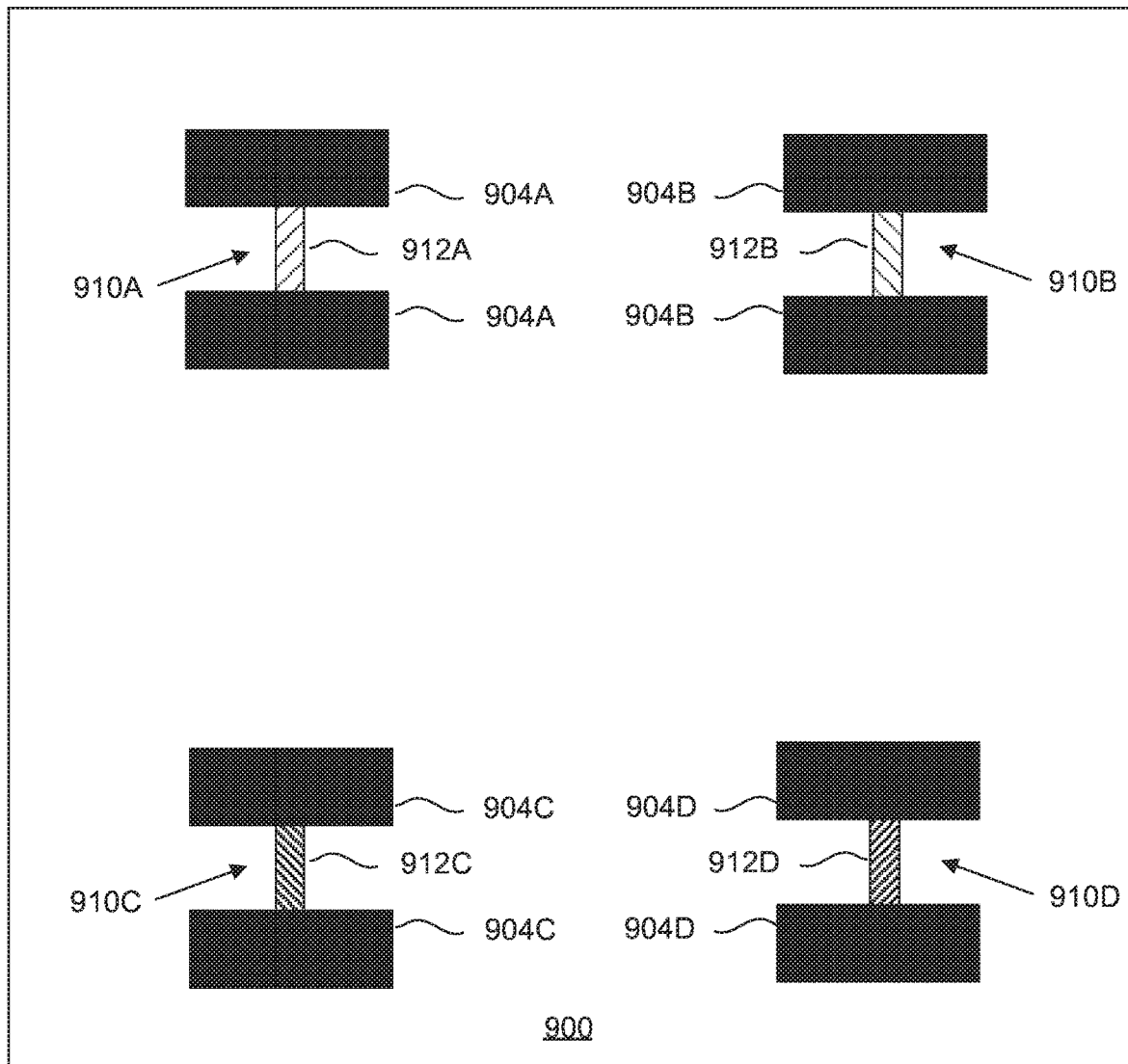
FIG. 7B illustrates a top view of a substrate containing multiple Josephson junctions following a laser anneal, in accordance with embodiments of the invention.

Referring to step S830, the Josephson junctions 902 of the Josephson junction array 900 are annealed, to form Josephson junctions 912 depicted in FIG. 7B (depicted as Josephson junction 912A, Josephson junction 912B, Josephson junction 912C, Josephson junction 912D). In one embodiment, annealing of the Josephson junctions 902 is performed such that each of the Josephson junctions in the array is annealed at a different power, for a different amount of time, and/or at a different wavelength in order to determine the results of multiple different fabrication setpoints. In a separate embodiment, the annealing conditions of the Josephson junctions 902 may be selected based on statistical characteristics contained in anneal database 716. The annealing conditions may be selected in order to develop a robust understanding of the possible outcomes from each anneal such as, for example, a variance of the resulting resistance, a distribution of results for a given set of conditions, and any other statistical metrics that may aid in determining a precise strategy for achieving a given setpoint. Such parameters may be selected to provide enough statistical confidence of the reproducibility of the steps to allow for reliable modification and fabrication of qubits on a chip.

Referring to step S840, the resistance of the Josephson junction 912 is determined. The resistance of the Josephson junction 912 may be determined at room temperature, or close to room temperature. In other embodiments, resistance may be measured at any suitable temperature, and may be selected as a matter of design or convenience. Measurement of resistance may be performed by measuring device 140 by, for example, applying a current across probing pads 904 and measuring the voltage across the Josephson junction 902.

Referring to step S850, the characteristics of the Josephson junction test structure 910 and annealing parameters are recorded in anneal database 716. By performing steps S810-S850 on multiple Josephson junction arrays, the anneal database 716 may have a robust data set of the different conditions in which the anneal may be performed, and the resulting change to a subsequently fabricated qubit containing a Josephson junction of similar parameters as those contained in the array 900. This detailed analysis of the resistance shift of a Josephson junction may enable post fabrication adjustment of a Josephson junction of the qubit, which may allow for precise design of each qubit on a multi-qubit chip despite the inherent variation of Josephson junction parameters resulting from the qubit fabrication process.

Figure 8:
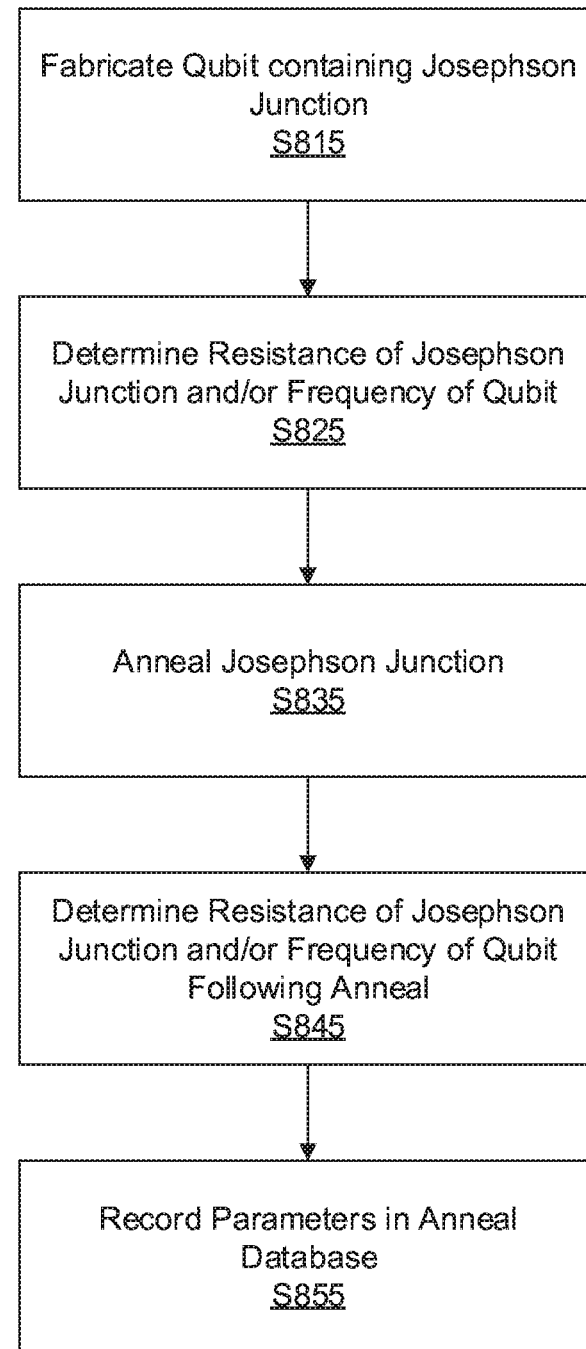
FIG. 8 is a flowchart illustrating the operations of the anneal program of FIG. 5, in accordance with embodiments of the invention.
Figure 9A:
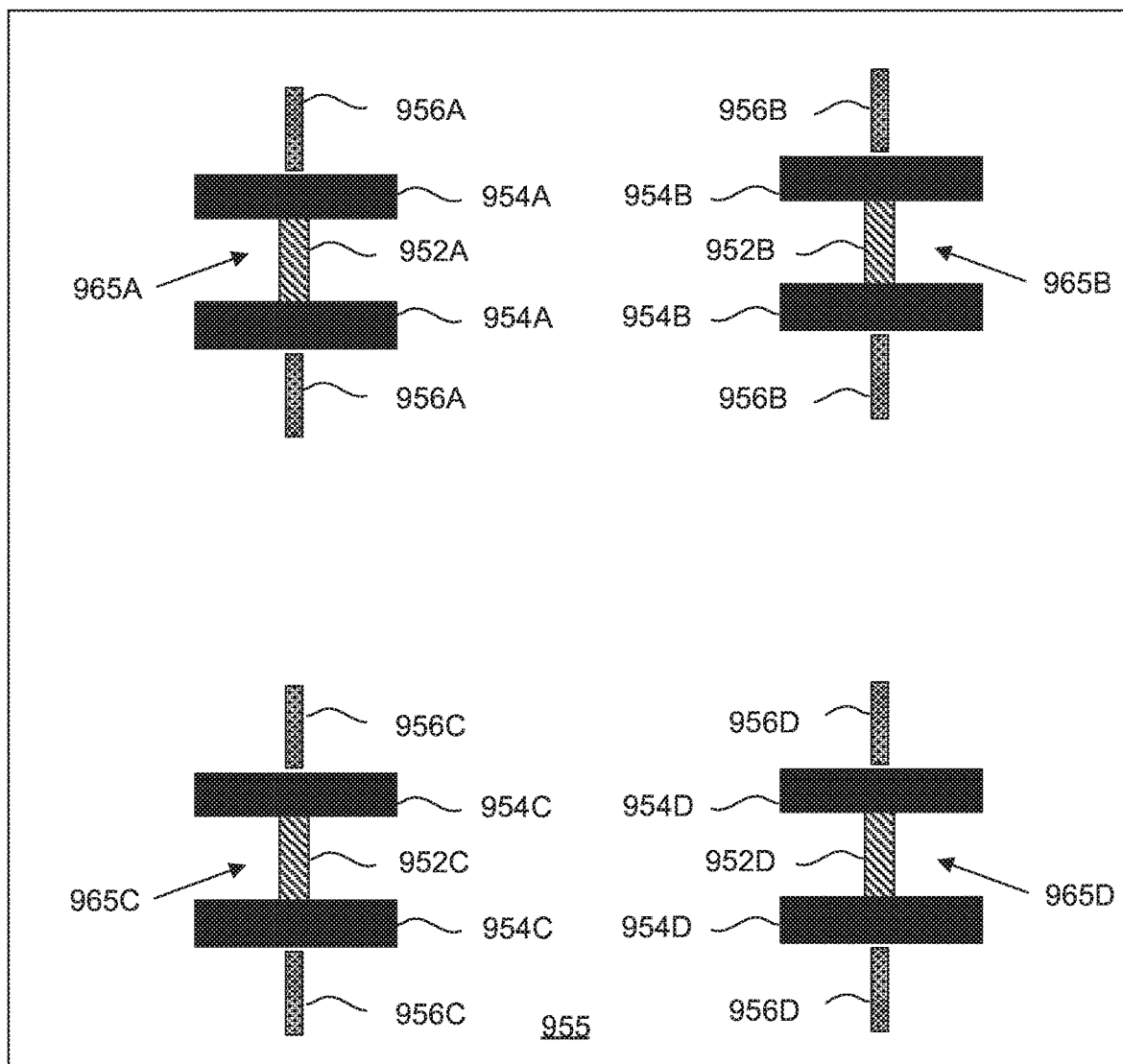
FIG. 9A illustrates a top view of a substrate containing multiple qubits, in accordance with embodiments of the invention.

FIG. 8 is a flow chart illustrating operations of anneal program 712. Referring to step S815, a qubit array 955, as depicted in FIG. 9A, is fabricated. A qubit array 955 may be one or more qubits located on a chip, where each qubit is at least able to be probed to determine a frequency of the qubit. Referring to FIG. 9A, a qubit array 955, containing qubit 965A, qubit 965B, qubit 965C, and qubit 965D (hereinafter the qubits 965), may be formed on a substrate according to the methods described above for forming a qubit 440 on substrate 400. In this context, an array is not specifically an ordered or regular arrangement, but instead a plurality of qubits located on the same structure. The qubits 965 may be formed concurrently with each other, consecutively or some combination thereof. Each of the qubits 965 contains a Josephson junction 952 (depicted as Josephson junction 952A, Josephson junction 952B, Josephson junction 952C, Josephson junction 952D), capacitive plates 954 (depicted as capacitive plates 954A, capacitive plates 954B, capacitive plates 954C, capacitive plates 954D), and superconducting line 956 (depicted as superconducting line 956A, superconducting line 956B, superconducting line 956C, superconducting line 956D), which relate to Josephson junction 402, capacitive plates 404 and line 406, respectively. Capacitive plates 954 may be similar to capacitive pads 454, but may be sized to allow for contacting of a resistance probe onto both capacitive plates 954 on opposite sides of the Josephson junction 952.

As a result of the fabrication process, the qubits 965 formed may have consistent dimensions (e.g. size and shape of capacitive plates 954). Therefore, the appearance of qubit 965A, qubit 965B, qubit 965C, and qubit 965D may be substantially similar, thereby forming qubits 965 with substantially uniform resistance across the qubit array 955. However, formation of the Josephson junction 952 may exhibit an uncontrolled variation in the resistance of the Josephson junction 952 for given fabrication conditions, due to process parameters being uncontrolled at the nanometer level. For Josephson junctions utilized in single-junction transmon qubits this variation may be typically +/−2%. A variation in junction resistance introduces a corresponding variation in qubit frequency. For example, in a single-junction transmon qubit a +/−2% variation in junction resistances leads to a −/+1% variation in the frequencies of the qubits. According to FIG. 9A, annealing may be performed to adjust the resistances of one or more of the Josephson junctions 952 in order to determine processing conditions that produce desired frequency shifts for given set of qubits.

In additional instances, a previously annealed Josephson junction within a qubit array may undergo additional annealing, in order to determine cumulative changes that may occur from the annealing process.

Referring to step S825, the resistance of the Josephson junction 952 of each qubit 965, and/or the frequency of the qubits 965 are determined. The resistance of the Josephson junction 952 may be determined at room temperature, or close to room temperature. In other embodiments, resistance may be measured at any suitable temperature, and may be selected as a matter of design or convenience. Measurement of resistance may be performed by a measuring device of measuring devices 740 by, for example, applying a current to the input of the qubit and measuring the voltage across the Josephson junction, in order to determine the resistance. The frequency may be determined by cooling qubits 965 down to superconducting temperatures, such as, for example, 0.01K to 0.1K, and performing frequency spectroscopy of the qubit.

Figure 9B:
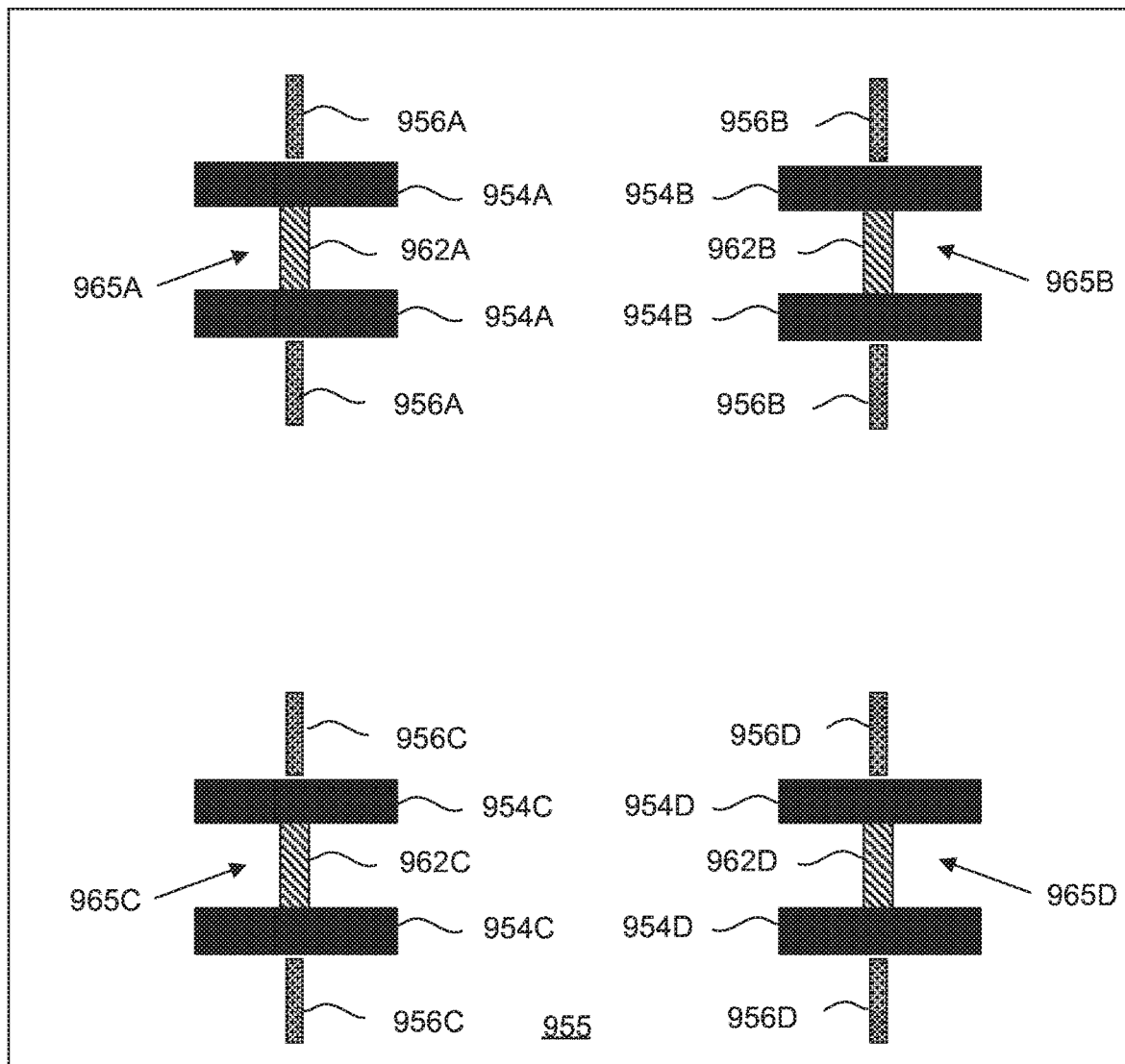
FIG. 9B illustrates a top view of a substrate containing multiple qubits following a laser anneal, in accordance with embodiments of the invention.

Referring to step S835, the Josephson junctions 952 of the qubit array 955 are annealed, to form Josephson junction 962 depicted in FIG. 9B (depicted as Josephson junction 962A, Josephson junction 962B, Josephson junction 962C, Josephson junction 962D). In one embodiment, annealing of the Josephson junctions 952 is performed such that each of the qubits in the array is annealed at a different power, for a different amount of time, and/or at a different wavelength in order to determine the results of multiple different fabrication setpoints. In a separate embodiment, the annealing conditions of the Josephson junctions 952 may be selected based on statistical characteristics, contained in anneal database 716. The annealing conditions may be selected in order to develop a robust understanding of the possible outcomes from each anneal such as, for example, a variance of the resulting resistance, a distribution of results for a given set of conditions, and any other statistical metrics that may aid in determining a precise strategy for achieving a given setpoint. Such parameters may be selected to provide enough statistical confidence of the reproducibility of the steps to allow for reliable modification and fabrication of qubits on a chip.

Referring to step S845, the resistance of the Josephson junction 962 of the qubit, and/or the frequency of the qubits 965 are determined for the annealed qubit. The resistance of the Josephson junction 962 may be determined at room temperature, or close to room temperature. In other embodiments, resistance may be measured at any suitable temperature, and may be selected as a matter of design or convenience. Measurement of resistance may be performed by a measuring device of measuring devices 740 by, for example, applying a current to the input of the qubit and measuring the voltage across the Josephson junction 962, in order to determine the resistance. The frequency may be determined by cooling the qubits 965 down to superconducting temperatures, such as, for example, 0.01K to 0.1K, and performing qubit frequency spectroscopy.

Referring to step S855, the characteristics of the qubits 965 and annealing parameters are recorded in anneal database 716. By performing steps S815-S855 on multiple qubit arrays, the anneal database 716 may have a robust data set of the different conditions in which the anneal may be performed, and the resulting change to the qubits 965. This may enable post qubit fabrication adjustment of the qubits 965, which may allow for precise design of each qubits 965 on a multi-qubit chip despite the inherent variation of Josephson junction parameters resulting from the qubit fabrication process.

Figure 10:
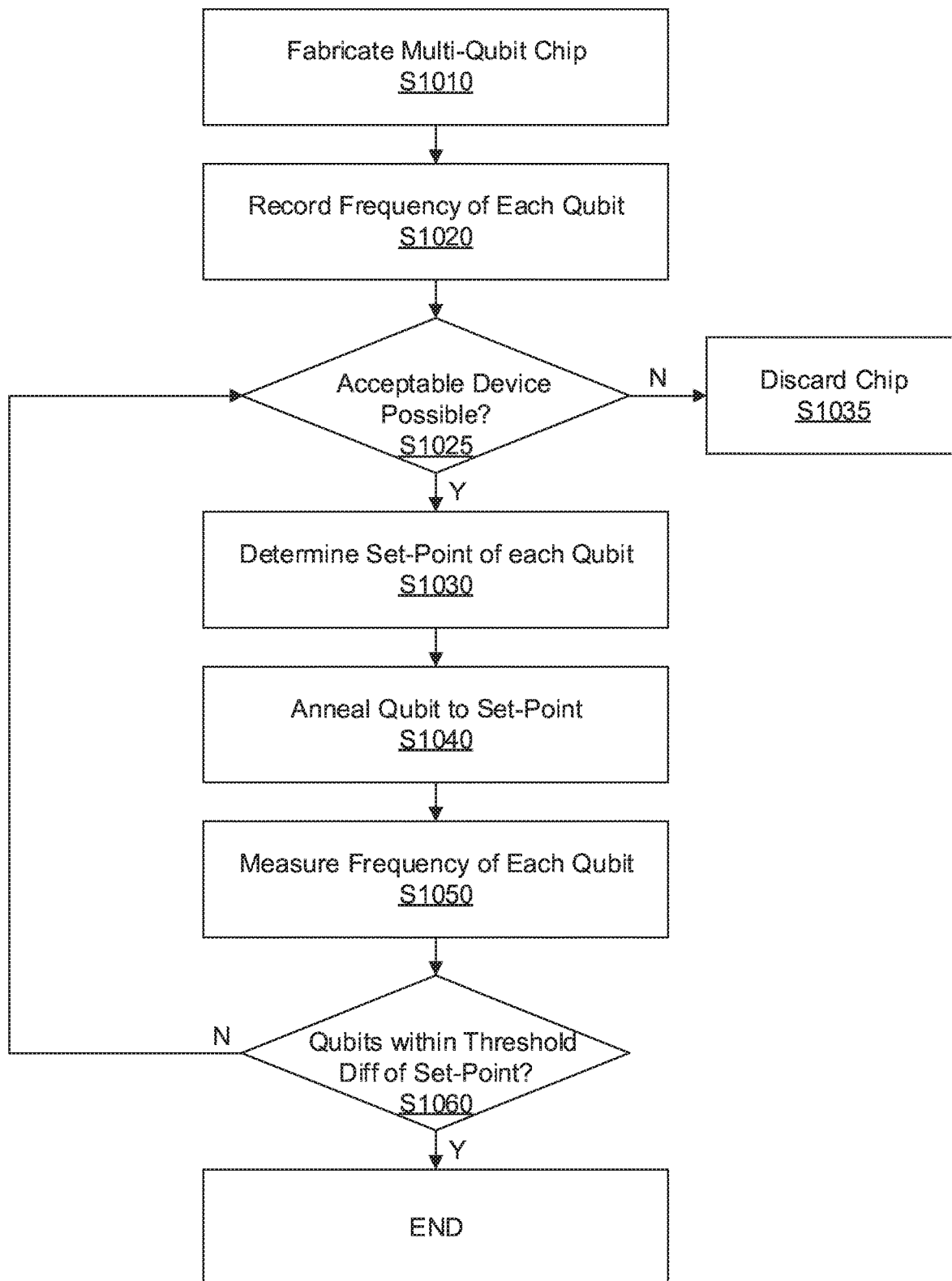
FIG. 10 is a flowchart illustrating the operations of an example embodiment of the qubit fabrication program of FIG. 5, in accordance with embodiments of the invention.
Figure 11A:
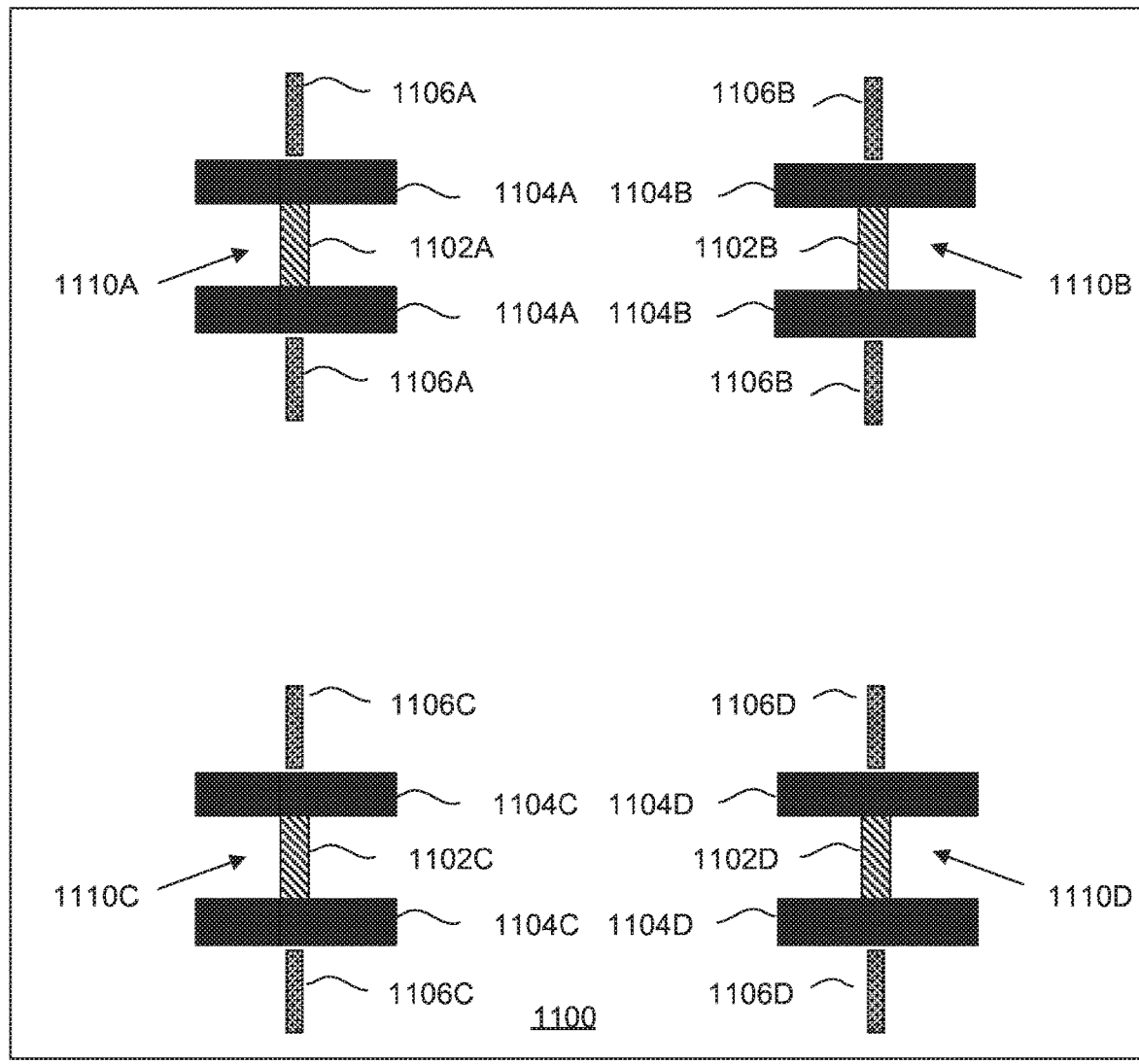
FIG. 11A illustrates a top view of a substrate containing multiple qubits, in accordance with embodiments of the invention.

FIG. 10 is a flow chart illustrating an embodiment of qubit fabrication program 714. While FIG. 10 is depicted as a computer program manufacturing a physical component, it should be understood that such a method may be performed without the use of computers. Referring to step S1010, a qubit chip 1100, as depicted in FIG. 11A, is fabricated. The qubit chip 1100 may be a chip having qubits and components able to perform quantum calculations. The qubit chip 1100 contains qubit 1110A, qubit 1110B, qubit 1110C, and qubit 1110D (hereinafter the qubits 1110), may be formed on a substrate according to the methods described above, in conjunction with FIG. 2, for forming a qubit 440 on substrate 400. The qubits 1110 may be formed concurrently with each other, consecutively or some combination thereof. Each of the qubits contains a Josephson junction 1102 (depicted as Josephson junction 1102A, Josephson junction 1102B, Josephson junction 1102C, Josephson junction 1102D), capacitive plates 1104 (depicted as Capacitive plate 1104A, Capacitive plate 1104B, Capacitive plate 1104C, Capacitive plate 1104D), and superconducting line 1106 (depicted as superconducting line 1106A, superconducting line 1106B, superconducting line 1106C, superconducting line 1106D), which relate to Josephson junction 402, capacitive plates 404 and line 406, respectively.

As a result of the fabrication process, for a given set of fabrication conditions the qubits 1110 formed may have consistent dimensions (e.g. size and shape of capacitive plates 1104, area and thickness of Josephson junction 1102). Therefore, the appearance of qubit 1110A, qubit 1110B, qubit 1110C, and qubit 1110D may be substantially similar, thereby forming qubits with substantially uniform capacitance across the device. However, in the formation of the Josephson junctions 1102, uncontrolled variables at the nanometer scale may introduce a random variation among the resistances of a group of qubits which in all other respects are identical. If the qubits are single-junction transmon qubits, then a +/−2% variation in the resistance of the Josephson junctions 1102 will cause a −/+1% variation in the frequencies of the qubits.

Referring to step S1020, the resistance of the Josephson junction 1102 of each qubit 1110, and/or the frequency of the qubit 1110 are determined. The resistance of the Josephson junction 1102 may be determined at room temperature, or close to room temperature. In other embodiments, resistance may be measured at any suitable temperature, and may be selected as a matter of design or convenience. Measurement of resistance may be performed by measuring device 140 by, for example, applying a current to the input of the qubit and measuring the voltage across the Josephson junction 1102, in order to determine the resistance. The frequency may be determined by cooling the qubit 1110 down to superconducting temperatures, such as, for example, 0.01K to 0.1K, and performing qubit frequency spectroscopy.

Referring to step S1025, the viability of fabricating the multi-qubit chip is determined. Based on the frequency and/or resistance determined in step S1020 for each qubit 1110, qubit fabrication program 714 may determine the range of possible frequencies that may be achieved for each qubit, based on the fabrication conditions contained in anneal database 716. Frequency collision model 718 may then determine whether it is possible to achieve an acceptable collision probability for any of the systems encompassed by the qubit ranges. If there is an acceptable collision probability, fabrication proceeds to step S1030. If there is not an acceptable collision probability, the chip is discarded in step S1035.

Referring to step S1030, the set-point of each qubit of the chip is determined. Based on the frequency and/or resistance determined in step S1020 for each qubit 1110, set-points, which may contain a range of acceptable values, may be determined for each qubit. The range of possible set-points may be based on what frequencies may be achieved through one or more anneals for each of the qubits. The set-point for each qubit may be determined based on frequency collision model 718, by modeling a plurality of frequencies for the qubits to determine collision probabilities of the system, and optimizing the relative values of the frequencies of the various qubits in the system, to minimize measured frequency collisions and consequently improve the multi-qubit gate fidelities.

Referring to step S1040, each qubit 1110 of the qubit chip 1100 may be annealed to adjust the frequency of the Josephson junction 1102 to the set-points determined in step S1030. The parameters of the anneal for each qubit 1110 may be determined by looking up the initial frequency of the qubit 1110, and the desired frequency of the qubit 1110 based on the set-point, in the anneal database 716 to find the parameters necessary to shift the resonance frequency of the qubit. Additionally, anneal parameters may be selected based on similarities in post-anneal processing of the current fabrication flow as compared to previous process conditions and the resulting structures. In another embodiment, the anneal may be performed in multiple steps in instances where a multi-step anneal would produce a more precise result than a single anneal. For example, in one embodiment annealing the Josephson junction 1102A to 1112A may be performed 90% of the time within an acceptable variance (e.g. a frequency range determined in step S1030 where the qubit would not collide with another qubit), based on historical anneal data contained in anneal database 716. However, qubit fabrication program 714 may determine that 2 anneals, each having 95% reliability, would be more likely to result in Josephson junction 1112A being within acceptable parameters. The anneal for each qubit may be performed independently of the other anneals by, for example, exhibiting different anneal conditions on qubit 1110A and qubit 1110B.

Annealing of the Josephson junction 1102 may include heating to allow for a physical change to occur within the Josephson junction 1102 that results in a change in the resistance, based on conditions outlined in the anneal database 716 to achieve a change from the initial to final qubit conditions determined above. In annealing of the Josephson junction 1102, annealing below a threshold dose may result in an increase in the resistance of the Josephson junction 1102, while annealing above that threshold may decrease the resistance of the Josephson junction 1102.

Referring to step S1050, the resistance of the Josephson junction 1112 of the qubit, and the frequency of the qubit, are determined. The resistance of the Josephson junction 1112 may be determined at room temperature, or close to room temperature. In other embodiments, resistance may be measured at any suitable temperature, and may be selected as a matter of design or convenience. Measurement of resistance may be performed by measuring device 140 by, for example, applying a current to the input of the qubit and measuring the voltage across the Josephson junction 1112, in order to determine the resistance. The frequency may be determined by cooling the qubit down to superconducting temperatures, such as, for example, 0.01K to 0.1K, and performing qubit frequency spectroscopy. The resistance and frequency may be recorded, along with any other relevant process parameters, in anneal database 716.

Referring to step S1060, qubit fabrication program 714 determines if each Josephson junction 1112 is within the range of frequencies determined in step S1030. If each Josephson junction 1112 is within the desired range (i.e. about the desired frequency), adjustment of the qubits is complete, and the qubit chip 1100 may undergo additional post-anneal processing to improve additional aspects of qubit performance. If each Josephson junction 1112 is not within the desired range, qubit fabrication program 714 returns to step S1030 to recompute possible set-points for each of the qubits 1110 to take into account the processing conditions already undergone. At step S1030 the frequency collision model may also compare the measured arrangement of qubit frequencies to a statistical model of the likelihood of frequency collisions, to assess whether these qubits are likely to be changed into a more optimal arrangement within a reasonable number of anneal steps. If the answer is no, then this chip may be rejected and qubit fabrication program is started again from step S1010.

Figure 11B:
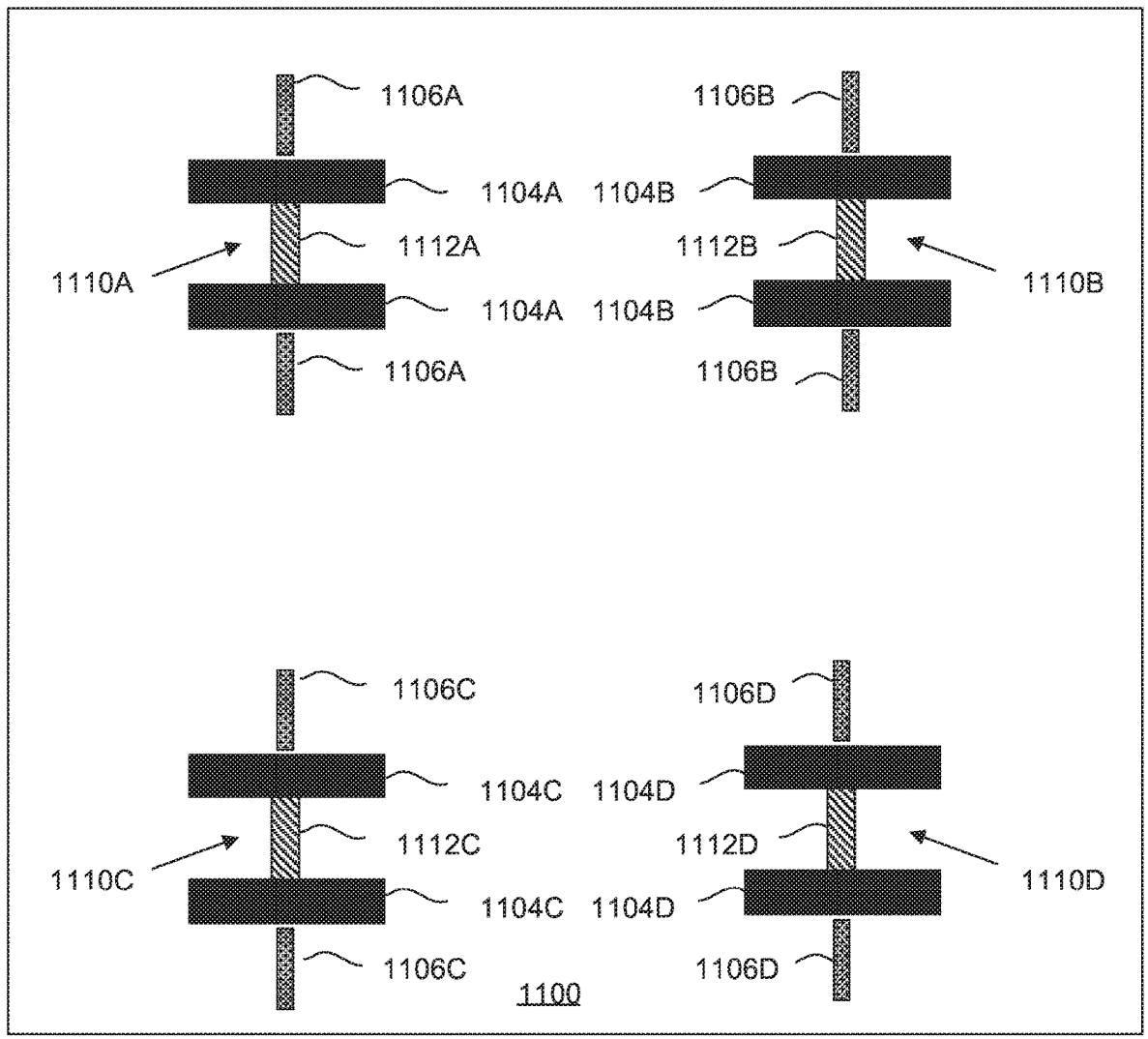
FIG. 11B illustrates a top view of a substrate containing multiple qubits following a laser anneal, in accordance with embodiments of the invention.

Following the process above, a qubit chip 1100, as depicted in FIG. 11B, is formed. The qubit chip 1100 contains qubit 1110A, qubit 1110B, qubit 1110C, and qubit 1110D. Qubit 1110A, qubit 1110B, qubit 1110C, and qubit 1110D may have substantially similar characteristics, except for the frequency resulting from different resistances of Josephson junction 1112A, Josephson junction 1112B, Josephson junction 1112C, and Josephson junction 1112D. The resistance of the Josephson junction 1112A, Josephson junction 1112B, Josephson junction 1112C, and Josephson junction 1112D may be adjusted from the initial resistance, and based on a feasible design of the multi-qubit chip to minimize collisions given the initial design conditions, of Josephson junction 1102A, Josephson junction 1102B, Josephson junction 1102C, and Josephson junction 1102D. Such a process may result in a fabrication of multi-qubit chips, where the frequency of a given qubit 1110 changes based on the initial resistance of the Josephson junction 1102, and therefore unlikely to reproduce identical, or substantially identical, chips in consecutive manufactures.

Figure 12:
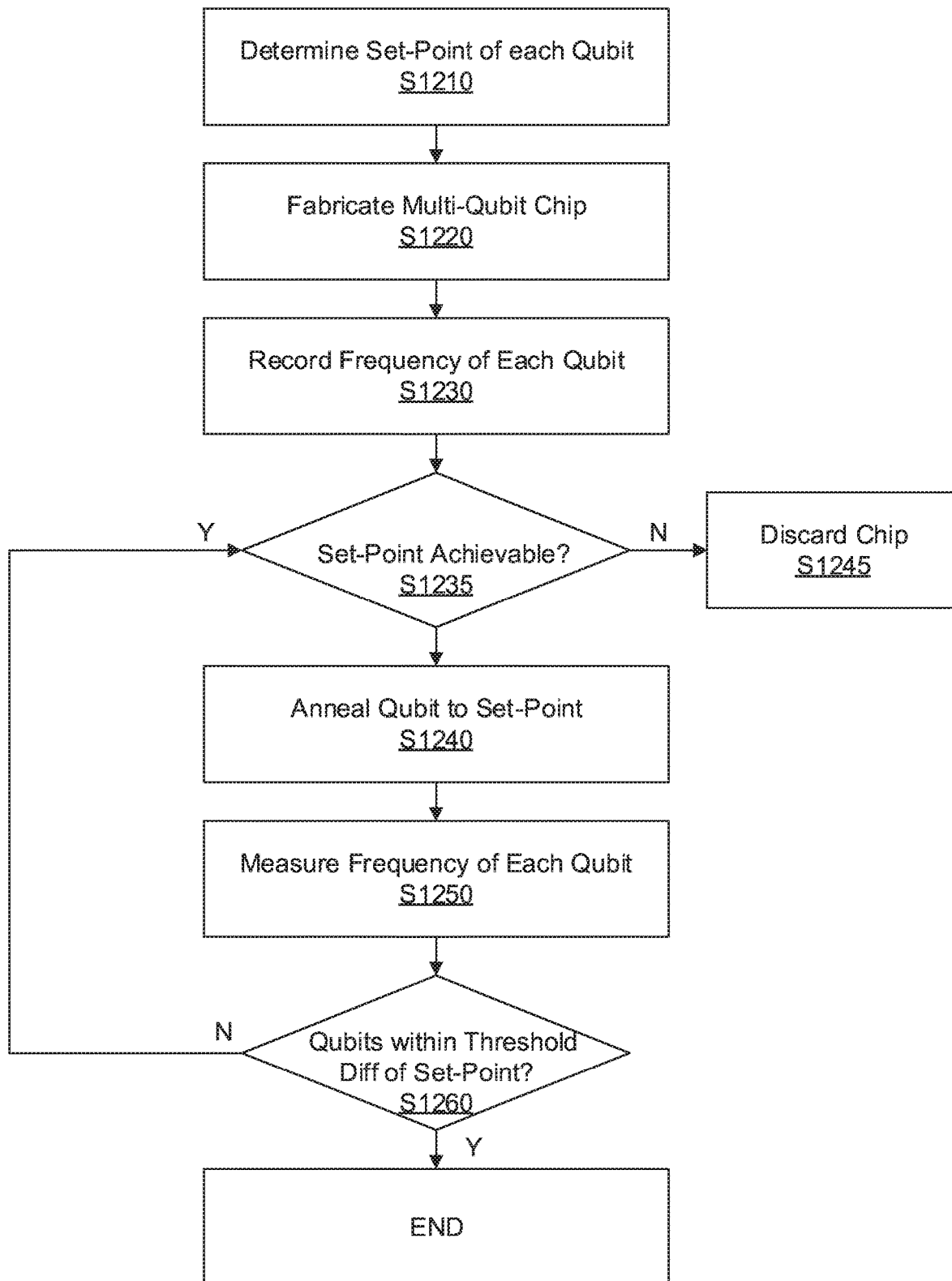
FIG. 12 is a flowchart illustrating the operations of an example embodiment of the qubit fabrication program of FIG. 5, in accordance with embodiments of the invention.

In an alternate embodiment, qubit fabrication program 714 may determine an optimal arrangement of frequencies for a chip prior to fabrication, and design the structures of the chip to meet the optimal layout, thereby creating a standardized quantum computing chip 1300. FIG. 12 is a flow chart illustrating an embodiment of qubit fabrication program 714. While FIG. 12 is depicted as a computer program manufacturing a physical component, it should be understood that such a method may be performed without the use of computers. Referring to step S1210, qubit fabrication program 714 may determine an optimal frequency design and layout for qubit chip 1300. The qubit fabrication program 714 may vary parameters of each qubit 1310, such as area of the Josephson junction 1302, to vary the frequencies of each qubit 1310 to enable placement of multiple qubits 1310 on a single chip while minimizing collisions between the qubits 1310. Those design parameters may be based on a frequency set-point, or acceptable frequency range, for each qubit 1310.

Figure 13A:
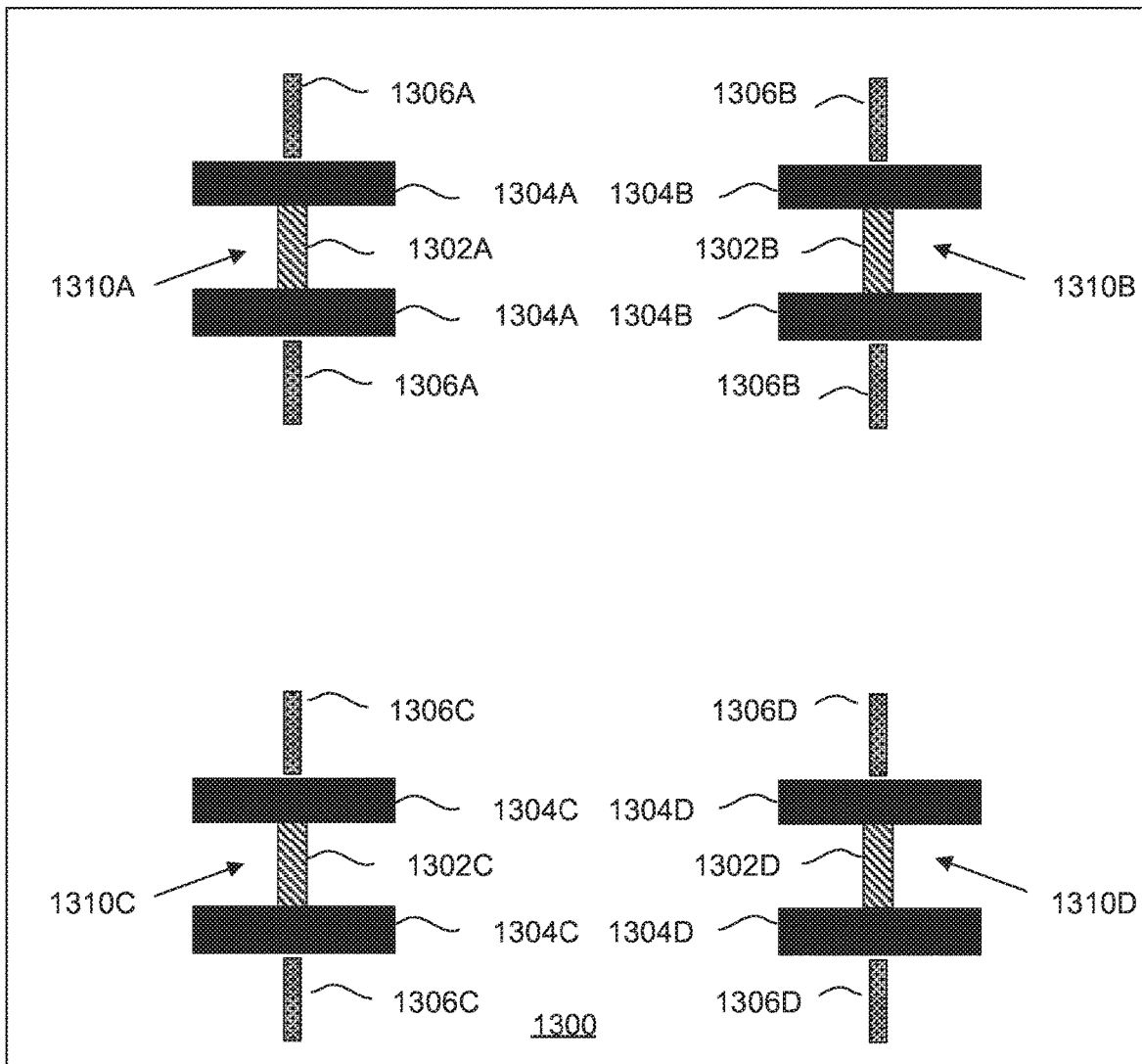
FIG. 13A illustrates a top view of a substrate containing multiple qubits, in accordance with embodiments of the invention.

Referring to step S1220, a qubit chip 1300, as depicted in FIG. 13A, is fabricated. The qubit chip 1300 contains qubit 1310A, qubit 1310B, qubit 1310C, and qubit 1310D (hereinafter the qubits 1310), may be formed on a substrate according to the methods described above, in conjunction with FIG. 2, for forming a qubit 440 on substrate 400. The qubits 1310 may be formed concurrently with each other, consecutively or some combination thereof. Each of the qubits contains a Josephson junction 1302 (depicted as Josephson junction 1302A, Josephson junction 1302B, Josephson junction 1302C, Josephson junction 1302D), capacitive plates 1304 (depicted as Capacitive plate 1304A, Capacitive plate 1304B, Capacitive plate 1304C, Capacitive plate 1304D), and superconducting line 1306 (depicted as superconducting line 1306A, superconducting line 1306B, superconducting line 1306C, superconducting line 1306D), which relate to Josephson junction 402, capacitive plates 404 and line 406, respectively.

As a result of the fabrication process, the qubits 1310 formed may have consistent dimensions (e.g. size and shape of capacitive plates 1304, area and thickness of Josephson junction 1302). Therefore, the appearance of qubit 1310A, qubit 1310B, qubit 1310C, and qubit 1310D may be substantially similar, thereby forming qubits with substantially uniform capacitance across the device. However, formation of the Josephson junctions 1302 may introduce an uncontrolled variation among the frequencies of qubits that are otherwise identical. For instance if the qubits are single-junction transmon qubits and their resistances vary by +/−2%, then their frequencies will vary by −/+1%.

Referring to step S1230, the resistance of the Josephson junction 1302 of each qubit 1310, and/or the frequency of the qubit 1310 are determined. The frequency may be determined by cooling the qubit 1110 down to superconducting temperatures, such as, for example, 0.01K to 0.1K, and preforming qubit frequency spectroscopy. Additionally, the resistance of the Josephson junction 1102 may be determined at room temperature or close to room temperature. In other embodiments, resistance may be measured at any suitable temperature, and may be selected as a matter of design or convenience. Measurement of resistance may be performed by measuring device 140 by, for example, applying a current to the input of the qubit and measuring the voltage across the Josephson junction 1102, in order to determine the resistance.

Referring to step S1235, the viability of fabricating the multi-qubit chip is determined. Based on the frequency and/or resistance determined in step S1230 for each qubit 1310, qubit fabrication program 714 may determine the range of possible frequencies that may be achieved for each qubit, based on the fabrication conditions contained in anneal database 716. Those ranges are then compared to the fabrication set-points. If the set-points are within the ranges determined, fabrication proceeds to step S1240. If the set-points are not within the ranges determined, the chip is discarded in step S1245.

Referring to step S1240, each qubit 1310 of the qubit chip 1300 may be annealed to adjust the frequency of the Josephson junction 1302 to the set-points determined in step S1230. The parameters of the anneal for each qubit 1310 may be determined by looking up the initial frequency of the qubit 1310, and the desired frequency of the qubit 1310 based on the set-point, in the anneal database 716 to find the parameters necessary to shift the frequency of the qubit. In another embodiment, the anneal may be performed in multiple steps in instances where a multi-step anneal would produce a more precise result than a single anneal. For example, in one embodiment annealing the Josephson junction 1302A to 1312A may be performed 90% of the time within an acceptable variance (e.g. a frequency range determined in step S1230 where the qubit frequency would not collide with another qubit frequency), based on historical anneal data contained in anneal database 716. However, qubit fabrication program 714 may determine that 2 anneals, each having 95% reliability, would be more likely to result in Josephson junction 1312A being within acceptable parameters. The anneal for each qubit may be performed independently of the other anneals by, for example, exhibiting different anneal conditions on qubit 1310A and qubit 1310B.

Annealing of the Josephson junction 1302 may include heating to allow for a physical change to occur within the Josephson junction 1302 that results in a change in the resistance, based on conditions outlined in the anneal database 716 to achieve a change from the initial to final qubit conditions determined above. In annealing of the Josephson junction 1302, annealing below a threshold dose may result in an increase in the resistance of the Josephson junction 1302, while annealing above that threshold may decrease the resistance of the Josephson junction 1302.

Referring to step S1250, the resistance of the Josephson junction 1312 of the qubit, and/or the frequency of the qubit are determined. The frequency may be determined by cooling the qubit down to superconducting temperatures, such as, for example, 0.01K to 0.1K, and performing qubit frequency spectroscopy. Alternatively, the resistance of the Josephson junction 1312 may be determined at room temperature, or close to room temperature. In other embodiments, resistance may be measured at any suitable temperature, and may be selected as a matter of design or convenience. The resistance and frequency may be recorded, along with any other relevant process parameters, in anneal database 716.

Referring to step S1260, qubit fabrication program 714 determines if each Josephson junction 1312 is within the range of frequencies (i.e. about the desired frequency) determined in step S1230. If each Josephson junction 1312 is within the desired range, adjustment of the qubits is complete, and the qubit chip 1300 may undergo additional post-anneal processing to improve additional aspects of qubit performance. If each Josephson junction 1312 is not within the desired range, qubit fabrication program 714 returns to step S1235 to recompute possible set-points for each of the qubits 1310 to take into account the processing conditions already undergone. At step S1235 the frequency collision model may also reference a statistical model of frequency collisions, to assess whether a reasonable number of anneal steps are likely to change these qubits into the frequencies determined in step S1210 within a reasonable number of anneal steps. If the answer is no, then this chip may be rejected and qubit fabrication program is started again from step S1210.

Figure 13B:
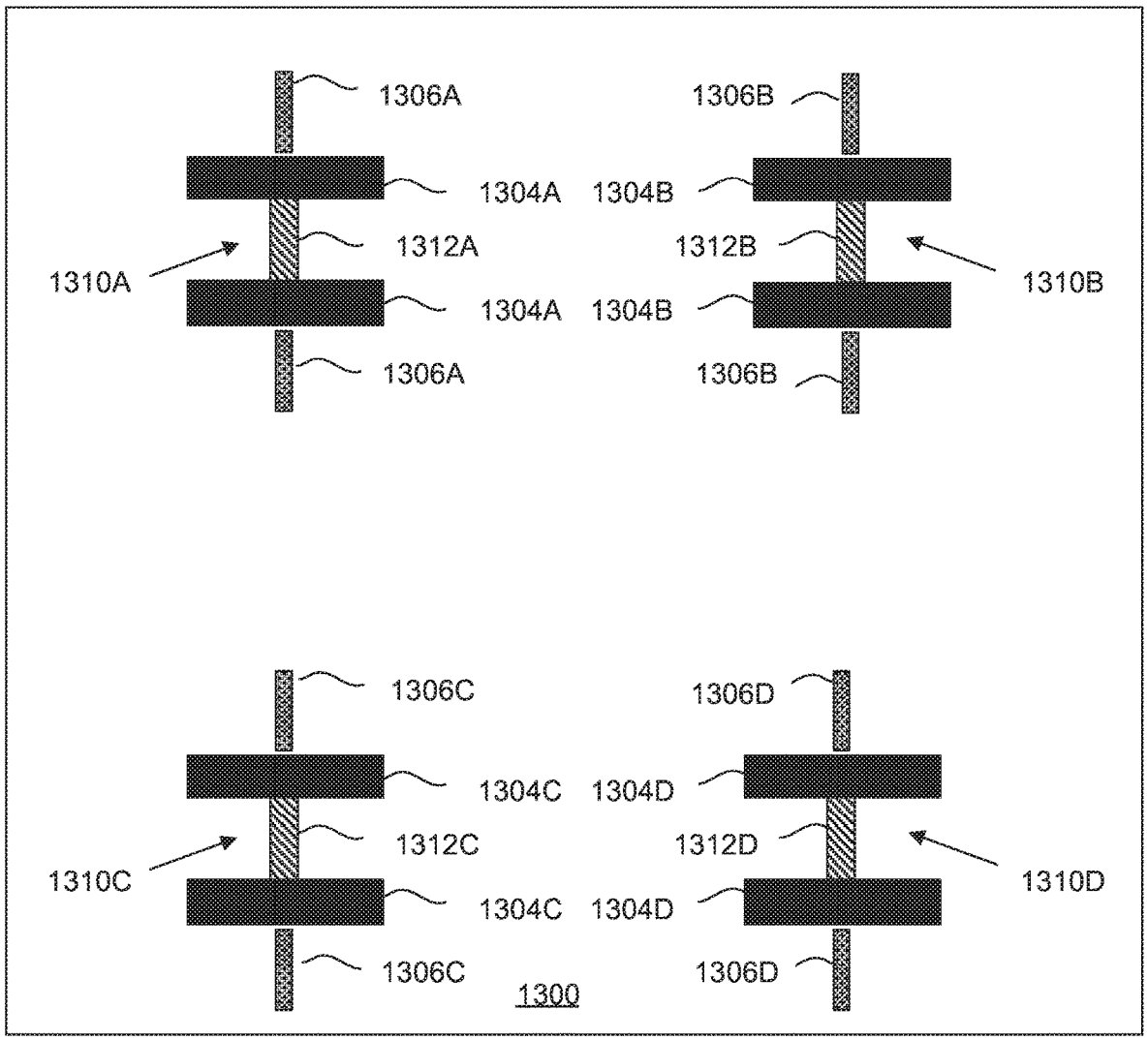
FIG. 13B illustrates a top view of a substrate containing multiple qubits following a laser anneal, in accordance with embodiments of the invention.

Following the process above, a qubit chip 1300, as depicted in FIG. 13B, is formed. The qubit chip 1300 contains qubit 1310A, qubit 1310B, qubit 1310C, and qubit 1310D. In some embodiments, qubit 1310A, qubit 1310B, qubit 1310C, and qubit 1310D may each have unique characteristics to achieve a setpoint frequency. In other embodiments, qubit 1310A, qubit 1310B, qubit 1310C, and qubit 1310D may have substantially similar characteristics, except for the frequency resulting from different resistances of Josephson junction 1312A, Josephson junction 1312B, Josephson junction 1312C, and Josephson junction 1312D. The resistances of the Josephson junction 1312A, Josephson junction 1312B, Josephson junction 1312C, and Josephson junction 1312D may be adjusted from their initial resistances, and based on an initial setpoint of each qubit, prior to fabrication. Such a process may result in a fabrication of multi-qubit chips, where frequency of a given qubit 1310 (e.g. qubit 1310A) is substantially similar for each manufacture of the multi-qubit chip, which may enable standardization of design for ancillary components of the multi-qubit chip.

Figure 14:
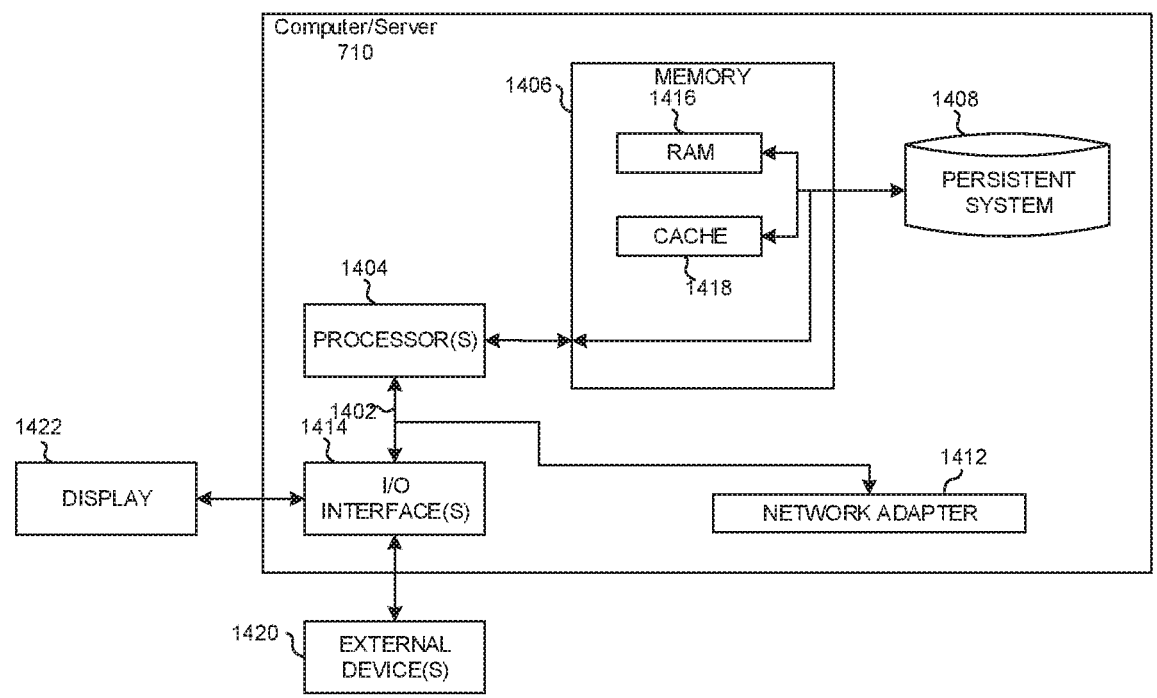
FIG. 14 is a block diagram depicting the hardware components of the multi-qubit chip manufacturing system of FIG. 5, in accordance with embodiments of the invention.

FIG. 14 depicts a block diagram of components of computing device 710, in accordance with an illustrative embodiment of the present invention. It should be appreciated that FIG. 14 provides only an illustration of one implementation and does not imply any limitations with regard to the environments in which different embodiments may be implemented. Many modifications to the depicted environment may be made.

Computing device 710 include communications fabric 1402, which provides communications between computer processor(s) 1404, memory 1406, persistent storage 1408, communications unit 1412, and input/output (I/O) interface(s) 1414. Communications fabric 1402 can be implemented with any architecture designed for passing data and/or control information between processors (such as microprocessors, communications and network processors, etc.), system memory, peripheral devices, and any other hardware components within a system. For example, communications fabric 1402 can be implemented with one or more buses.

Memory 1406 and persistent storage 1408 are computer-readable storage media. In this embodiment, memory 1406 includes random access memory (RAM) 1416 and cache memory 1418. In general, memory 1406 can include any suitable volatile or non-volatile computer-readable storage media.

The programs anneal program 712, qubit fabrication program 714, anneal database 716, and frequency collision model 718 in computing device 710 are stored in persistent storage 1408 for execution by one or more of the respective computer processors 1404 via one or more memories of memory 1406. In this embodiment, persistent storage 1408 includes a magnetic hard disk drive. Alternatively, or in addition to a magnetic hard disk drive, persistent storage 1408 can include a solid state hard drive, a semiconductor storage device, read-only memory (ROM), erasable programmable read-only memory (EPROM), flash memory, or any other computer-readable storage media that is capable of storing program instructions or digital information.

The media used by persistent storage 1408 may also be removable. For example, a removable hard drive may be used for persistent storage 1408. Other examples include optical and magnetic disks, thumb drives, and smart cards that are inserted into a drive for transfer onto another computer-readable storage medium that is also part of persistent storage 1408.

Communications unit 1412, in these examples, provides for communications with other data processing systems or devices. In these examples, communications unit 1412 includes one or more network interface cards. Communications unit 1412 may provide communications through the use of either or both physical and wireless communications links. The programs anneal program 712, qubit fabrication program 714, anneal database 716, and frequency collision model 718 in computing device 710 may be downloaded to persistent storage 1408 through communications unit 1412.

I/O interface(s) 1414 allows for input and output of data with other devices that may be connected to computing device 710. For example, I/O interface 1414 may provide a connection to external devices 1420 such as a keyboard, keypad, a touch screen, and/or some other suitable input device. External devices 1420 can also include portable computer-readable storage media such as, for example, thumb drives, portable optical or magnetic disks, and memory cards. Software and data used to practice embodiments of the present invention, e.g., The programs anneal program 712, qubit fabrication program 714, anneal database 716, and frequency collision model 718 in computing device 710 can be stored on such portable computer-readable storage media and can be loaded onto persistent storage 1408 via I/O interface(s) 1414. I/O interface(s) 1414 can also connect to a display 1422.

Display 1422 provides a mechanism to display data to a user and may be, for example, a computer monitor.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While steps of the disclosed method and components of the disclosed systems and environments have been sequentially or serially identified using numbers and letters, such numbering or lettering is not an indication that such steps must be performed in the order recited, and is merely provided to facilitate clear referencing of the method's steps. Furthermore, steps of the method may be performed in parallel to perform their described functionality.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein. It is therefore intended that the present invention not be limited to the exact forms and details described and illustrated but fall within the scope of the appended claims.

What is claimed is:

1. A method of forming a multi-qubit chip, the method comprising:
    forming a plurality of qubits on a chip, wherein each qubit comprises a Josephson junction and a capacitor connected in parallel with one another;
    measuring a resonance frequency of each qubit on the chip;
    determining a set-point frequency for each qubit that achieves a defined collision probability with respect to a probability of frequency collisions between adjacent qubits; and
    annealing a first Josephson junction of a first qubit of the plurality of qubits using a laser, based on parameters for the annealing from a database that relates the parameters to frequency shifts, to change the resonance frequency of the first qubit from a first resonance frequency to about a first set-point frequency determined for the first qubit.

2. The method of claim 1, wherein annealing the first Josephson junction comprises localized laser annealing of the first Josephson junction.

3. The method of claim 1, wherein annealing the first Josephson junction causes the first resonance frequency to increase.

4. The method of claim 3, further comprising:
    annealing a second Josephson junction of a second qubit of the plurality of qubits using the laser, wherein annealing the second Josephson junction causes a second frequency of the second qubit to decrease to a second set-point frequency determined for the second qubit.

5. The method of claim 1, wherein annealing the first Josephson junction causes the first resonance frequency to decrease.

6. The method of claim 1, wherein a parameter of the parameters for annealing the first Josephson junction is selected based on the database relating the parameters to the frequency shifts.

7. A method of forming a multi-qubit chip, the method comprising:
    determining a set-point frequency for each qubit of a plurality of qubits on the multi-qubit chip that achieves a defined collision probability with respect to a probability of frequency collisions between adjacent qubits;
    forming the plurality of qubits on the multi-qubit chip in accordance with the set-point frequency for each qubit, wherein each qubit comprises a Josephson junction and a capacitor connected in parallel with one another;
    measuring a first frequency of a first qubit of the plurality of qubits; and
    annealing the Josephson junction of the first qubit, based on parameters for the annealing from a database that relates the parameters to frequency shifts, to alter the first frequency of the first qubit from the first frequency to about a first set-point frequency determined for the first qubit.

8. The method of claim 7, wherein annealing the Josephson junction comprises localized laser annealing of the Josephson junction.

9. The method of claim 7, wherein annealing the Josephson junction causes the first frequency to increase.

10. The method of claim 9, wherein the Josephson junction is a first Josephson junction, and further comprising:
    annealing a second Josephson junction of a second qubit of the plurality of qubits using a laser, wherein annealing the second Josephson junction causes a second frequency of the second qubit to decrease to a second set-point frequency determined for the second qubit.

11. The method of claim 7, wherein annealing the Josephson junction causes the first frequency to decrease.

12. The method of claim 7, wherein forming the plurality of qubits is based on the set-point frequency for each of the plurality of qubits, and wherein a first size and a first shape of the first qubit are different from a second size and a second shape of a second qubit of the plurality of qubits.

13. A multi-qubit chip formed by:
forming a plurality of qubits on a chip, wherein each qubit comprises a Josephson junction and a capacitor connected in parallel with one another;
measuring a resonance frequency of each qubit on the chip;
determining a set-point frequency for each qubit that achieves a defined collision probability with respect to a probability of frequency collisions between adjacent qubits; and
annealing a first Josephson junction of a first qubit of the plurality of qubits, based on parameters for the annealing from a database that relates the parameters to frequency shifts, to modify the resonance frequency of the first qubit from a first resonance frequency to about a first set-point frequency determined for the first qubit; and
annealing a second Josephson junction of a second qubit of the plurality of qubits, based on the parameters from the database, to modify the resonance frequency of the second qubit from a second resonance frequency to about a second set-point frequency determined for the second qubit, wherein the first set-point frequency is different than the second set-point frequency.

14. The multi-qubit chip of claim 13, wherein annealing the first Josephson junction comprises localized annealing of the first Josephson junction.

15. The multi-qubit chip of claim 13, wherein annealing the first Josephson junction causes the first resonance frequency to increase.

16. The multi-qubit chip of claim 15, further comprising:
annealing the second Josephson junction of the second qubit of the plurality of qubits using a laser.

17. The multi-qubit chip of claim 13, wherein annealing the first Josephson junction causes the first resonance frequency to decrease.

18. A multi-qubit chip formed by:
determining a set-point frequency for each qubit of a plurality of qubits on the multi-qubit chip that achieves a defined collision probability with respect to a probability of frequency collisions between adjacent qubits;
based on the set-point frequency for each qubit, forming the plurality of qubits on the multi-qubit chip, wherein each qubit comprises a Josephson junction and a capacitor connected in parallel with one another;
measuring a first frequency of a first qubit of the plurality of qubits; and
annealing the Josephson junction of the first qubit, based on parameters for the annealing from a database that relates the parameters to frequency shifts, to adjust the frequency of the first qubit from the first frequency to about a first set-point frequency determined for the first qubit.

19. The multi-qubit chip of claim 18, wherein annealing the Josephson junction comprises localized annealing of the first Josephson junction.

20. The multi-qubit chip of claim 18, wherein annealing the Josephson junction causes the first frequency to increase.

21. The multi-qubit chip of claim 20, wherein the Josephson junction is a first Josephson junction, and further comprising:
annealing a second Josephson junction of a second qubit of the plurality of qubits using a laser, wherein annealing the second Josephson junction causes a second frequency of the second qubit to decrease to a second set-point frequency determined for the second qubit.

22. The multi-qubit chip of claim 18, wherein annealing the Josephson junction causes the first frequency to decrease.

23. The multi-qubit chip of claim 18, wherein forming the plurality of qubits is based on the set-point frequency for each of the plurality of qubits, and wherein the a size and a shape of the first qubit are different from the another size and another shape of a second qubit of the plurality of qubits.

24. A method of forming a multi-qubit chip, the method comprising:
forming a plurality of qubits on a chip, wherein each qubit comprises a trilayer Josephson junction and a capacitor connected in parallel with one another, wherein the trilayer Josephson junction comprises a first aluminum layer, an aluminum-oxide layer, and a second aluminum layer;
measuring a resonance frequency of each qubit on the chip;
determining a set-point frequency for each qubit that achieves a defined collision probability with respect to a probability of frequency collisions between adjacent qubit; and
annealing the trilayer Josephson junction of each of the plurality of qubits using a laser, based on parameters for the annealing from a database that relates the parameters to frequency shifts, to cause the resonance frequency of each of the plurality of qubits to change from the resonance frequency to the set-point frequency determined for each qubit.

* * * * *